United States Patent
Kim et al.

(10) Patent No.: US 7,451,383 B2
(45) Date of Patent: Nov. 11, 2008

(54) RATE MATCHING DEVICE AND METHOD FOR A DATA COMMUNICATION SYSTEM

(75) Inventors: Min-Goo Kim, Suwon-shi (KR); Beong-Jo Kim, Songnam-shi (KR); Se-Hyoung Kim, Seoul (KR); Soon-Jae Choi, Songnam-shi (KR); Young-Hwan Lee, Songnam-shi (KR)

(73) Assignee: Samsung Electronics Co., Ltd (KR)

( * ) Notice: Subject to any disclaimer, the term of this patent is extended or adjusted under 35 U.S.C. 154(b) by 65 days.

(21) Appl. No.: 10/867,459

(22) Filed: Jun. 14, 2004

(65) Prior Publication Data
US 2004/0243904 A1    Dec. 2, 2004

Related U.S. Application Data

(63) Continuation of application No. 09/611,014, filed on Jul. 6, 2000, now Pat. No. 6,751,772.

(30) Foreign Application Priority Data

Jul. 6, 1999    (KR) ............................... 1999-26978
Jul. 10, 1999   (KR) ............................... 1999-27865

(51) Int. Cl.
  H03M 13/03    (2006.01)
  H03M 13/00    (2006.01)
  G06F 11/00    (2006.01)
(52) U.S. Cl. .................. 714/786; 714/755; 714/790; 714/800
(58) Field of Classification Search ................ 714/755, 714/756, 786, 790, 746, 758, 800
See application file for complete search history.

(56) References Cited

U.S. PATENT DOCUMENTS 5,909,434 A    6/1999    Odenwalder et al.

(Continued)

FOREIGN PATENT DOCUMENTS

JP    11-502679    3/1999

(Continued)

OTHER PUBLICATIONS

TS 1.22 v2.0.0 dated Apr. 1999.

(Continued)

*Primary Examiner*—Phung M Chung
(74) *Attorney, Agent, or Firm*—The Farrell Law Firm, PC

(57) ABSTRACT

A device and method for rate matching channel-encoded symbols in a data communication system. The rate matching device and method can be applied to a data communication system which uses one or both of a non-systematic code (such as a convolutional code or a linear block code) and a systematic code (such as a turbo code). In one aspect, the rate matching device includes a plurality of rate matching blocks, the number of the rate matching blocks being equal to a reciprocal of a coding rate of a channel encoder. The rate matching device can rate match the symbols encoded with a non-systematic code or the symbols encoded with a systematic code, by changing initial parameters including the number of input symbols, the number of output symbols, and the puncturing or repetition pattern determining parameters.

52 Claims, 9 Drawing Sheets

U.S. PATENT DOCUMENTS

| | | | |
|---|---|---|---|
| 5,978,365 A | * | 11/1999 | Yi .............................. 370/331 |
| 6,088,387 A | * | 7/2000 | Gelblum et al. ............. 375/222 |
| 6,397,367 B1 | * | 5/2002 | Park et al. ................... 714/786 |
| 6,601,214 B1 | * | 7/2003 | Hammons, Jr. ............. 714/790 |
| 7,027,422 B2 | * | 4/2006 | Belaiche ..................... 370/335 |

FOREIGN PATENT DOCUMENTS

| | | |
|---|---|---|
| JP | 11-145936 | 5/1999 |
| JP | 11-163841 | 6/1999 |
| JP | 2001-522198 | 11/2001 |
| WO | WO 96/23360 | 8/1996 |
| WO | WO 99/07076 | 2/1999 |
| WO | WO 99/11009 | 3/1999 |
| WO | WO 99/23798 | 5/1999 |

OTHER PUBLICATIONS

"Proposal for Rate Matching for Turbo Codes" dated May 1999.

Cain et al., "Punctured Convolutional Codes of Rate (n-1)/n and Simplified Maximum Likelihood Decoding", IEEE Trans. Inform. Theory, vol. 1T-25, pp. 97-100, Jan. 1979.

Forney, "Convolutional Codes I: Algebraic Structure", IEEE Trans. Inform. Theory, vol. 1T-16, pp. 720-738, Nov. 1970.

Nortel Netorks: Proposal for Rate Matching for Turbo Codes, Database www.3gpp.org, 3rd Generation Partnership Project; May 12, 1999.

RAN WG1: "Rate Matching Algorithm", Technical Specification Group, Radio Access Network, Meeting #3, Database www.3gpp.org, 3rd Generation Partnership Project; Apr. 1999.

Answer, Affirmative Defenses, and Counterclaims of Samsung in *Ericsson Inc. v. Samsung Electronics Co., LTD.*, 2:06cv00063 (TJW), Eastern District of Texas, Marshall Division.

Reply to Counterclaims in *Ericsson Inc. v. Samsung Electronics Co., LTD.*, 2:06cv00063 (TJW), Eastern District of Texas, Marshall Division.

Order in *Ericsson Inc. v. Samsung Electronics Co., LTD.*, 2:06cv00063 (TJW), Eastern District of Texas, Marshall Division.

* cited by examiner

RATE MATCHING DEVICE AND METHOD FOR A DATA COMMUNICATION SYSTEM

PRIORITY

This application is a continuation application of application Ser. No. 09/611,014, filed Jul. 6, 2000, now U.S. Pat. No. 6,751,772, which claims priority to an application entitled "Rate Matching Device and Method for Data Communication System" filed in the Korean Industrial Property Office on Jul. 6, 1999 and assigned Ser. No. 99-26978, and an application entitled "Rate Matching Device and Method for Data Communication System" filed in the Korean Industrial Property Office on Jul. 10, 1999 and assigned Ser. No. 99- 27865, the contents of each of which are incorporated herein by reference.

BACKGROUND OF THE INVENTION

1. Field of the Invention

The present invention relates generally to a channel encoding device and method for a data communication system, and in particular, to a device and method for rate matching of channel-encoded symbols.

2. Description of the Related Art

Generally, in digital communication systems such as satellite systems, ISDN (Integrated Services Digital Network) systems, digital cellular systems, W-CDMA (Wideband Code Division Multiple Access) systems, UMTS (Universal Mobile Telecommunication Systems) and IMT-2000 (International Mobile Telecommunication-2000) systems, source user data is channel encoded with an error correction code before transmission in order to increase the reliability of the system. A convolutional code and a linear block code are typically used for channel encoding, and, for the linear block code, a single decoder is used. Recently, in addition to such codes, a turbo code is also being widely used, which is useful for data transmission and reception.

In multiple access communication systems which support multiple users and multi-channel communication systems with multiple channels, channel encoded symbols are matched to a given number of transmission channel symbols, in order to increase the efficiency of data transmission and to improve system performance. Such a process is called "rate matching" Rate matching is also performed to match the output symbol rate with the transmission symbol rate. Typical rate matching methods include puncturing or repeating parts of channel-encoded symbols.

A conventional rate matching device is shown in FIG. 1. Referring to FIG. 1, a channel encoder 100 encodes input information bits (k) at a coding rate R=k/n, and outputs encoded symbols (n). A multiplexer (MUX) 110 multiplexes the encoded symbols. A rate matching block 120 rate-matches the multiplexed encoded symbols by puncturing or repeating, and outputs the rate-matched symbols to a transmitter (not shown). The channel encoder 100 operates at every period of a symbol clock having a speed of CLOCK, and the multiplexer 110 and the rate matching block 120 operate at every predetermined period of a clock having a speed of n×CLOCK.

It should be noted that the rate matching device of FIG. 1 is proposed to be applied to the case where a non-systematic code such as a convolution code or a linear block code is used for channel encoding. For symbols, channel-encoded with a non-systematic code such as a convolutional code or a linear block code, because there is no weight between symbols, i.e., since the error sensitivity of the encoded symbols output from the channel encoder 100 is similar for every symbol within one frame, it is possible that the symbols encoded by the channel encoder 100 are provided to the rate matching block 120 without distinction and undergo puncturing or repeating, as shown in FIG. 1.

However, when using systematic codes, such as a turbo code, there is weight between symbols, so it is not good for the channel encoded symbols that are provided to the rate matching block 120 to equally undergo puncturing or repeating. Because the weight is not equal between information symbols and parity symbols, it is preferable for the rate matching block 120 to puncture parity symbols out of the turbo-encoded symbols, but not puncture the information symbols. As an alternative case, the rate matching block 120 can repeat the information symbols out of the turbo-encoded symbols to increase the energy of the symbols, but should not repeat the parity symbols, if possible. That is, it is difficult to use the rate matching device of FIG. 1 when a turbo code is being used. This is natural in the light of the facts that the structure of FIG. 1 is available for only non-systematic codes such as convolutional codes or linear block codes, and the turbo code has new properties different from those of the convolutional codes and the linear block codes.

Recently, to solve such a problem, a method has been proposed for rate matching the symbols channel-encoded with the turbo code. However, such a method can be used only when rate matching the turbo-encoded symbols, and cannot be used when rate matching the symbols channel-encoded with the existing convolutional codes or linear block codes.

Therefore, there is a need for a single device and method for rate matching both symbols channel-encoded with existing non-systematic code and symbols channel-encoded with systematic code. For example, a data communication system designed to support both non-systematic code and systematic code requires two different structures in order to rate match both codes, causing an increase in complexity. However, if it is possible to rate match the different codes using a single structure, the complexity of implementation will be reduced.

SUMMARY OF THE INVENTION

It is, therefore, an object of the present invention to provide a device and method for rate matching both symbols channel-encoded with a non-systematic code and symbols channel-encoded with a systematic code, using a single structure, in a data communication system.

It is another object of the present invention to provide a device and method for selectively rate matching symbols channel-encoded with a non-systematic code or symbols channel-encoded with a systematic code in a data communication system supporting both non-systematic code and systematic code.

It is further another object of the present invention to provide a device and method for rate matching channel-encoded symbols to increase the efficiency of data transmission and to improve system performance in a data communication system.

To achieve the above and other objects, a device and method for matching a rate of channel-encoded symbols in a data communication system is proposed. The rate matching device and method can be applied to a data communication system which uses one or both of a non-systematic code (convolutional code or linear block code) and a systematic code (turbo code). The rate matching device includes a plurality of rate matching blocks, the number of the rate matching blocks being equal to a reciprocal of the coding rate of the channel encoder. The rate matching device can rate match the symbols encoded with a non-systematic code or the symbols encoded with a systematic code, by changing initial parameters including the number of input symbols, the number of output symbols, and the puncturing/repetition pattern determining parameters.

BRIEF DESCRIPTION OF THE DRAWINGS

The above and other objects, features and advantages of the present invention will become more apparent from the following detailed description when taken in conjunction with the accompanying drawings in which.

DETAILED DESCRIPTION OF THE PREFERRED EMBODIMENT

Figure 1:
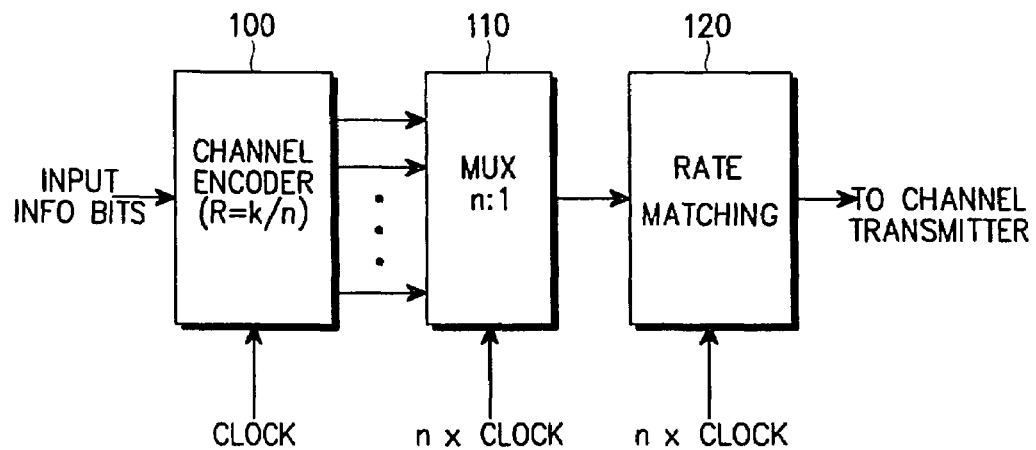
FIG. 1 is a diagram illustrating a structure of a rate matching device according to the prior part.

Preferred embodiments of the present invention will be described herein below with reference to the accompanying drawings. In the following description, well-known functions or constructions are not described in detail since they would obscure the invention in unnecessary detail.

Conditions Required When Designing a Rate Matching Device

First, before describing the invention, reference will be made to conditions which should be considered when rate mating symbols channel-encoded with a non-systematic code such as a convolutional code or a linear block code (in the description below, the non-systematic code is assumed to be a convolutional code). Conditions 1A to 3A below are the conditions which should be considered when rate matching encoded symbols by puncturing, and Conditions 1C and 2C below are the conditions which should be considered when rate matching encoded symbols by repeating.

Condition 1A: An input symbol sequence, being encoded symbols, should be punctured using a puncturing pattern having a specific period.

Condition 2A: The number of punctured bits out of the input symbols should be minimized, if possible.

Condition 3A: A uniform puncturing pattern should be used such that the input symbol sequence, which is encoded symbols output from an encoder, should be uniformly punctured.

Condition 1C: An input symbol sequence, being encoded symbols, should be repeated using a repetition pattern having a specific period.

Condition 2C: A uniform repetition pattern should be used such that the input symbol sequence, which is encoded symbols output from an encoder, should be uniformly repeated.

These conditions are based on the assumption that the error sensitivity of the symbols output from the encoder using a convolutional code is almost the same for every symbol within one frame (or codeword). Actually, it is known that when the above conditions are used as main limitation factors in performing puncturing for rate matching, affirmative results are obtained as shown by the following references: [1] G. D. Forney, "Convolutional codes I: Algebraic structure," IEEE Trans. Inform. Theory, vol. IT-16, pp.720-738, Nov. 1970, [2] J. B. Cain, G. C. Clark, and J. M. Geist, "Punctured convolutional codes of rate (n-1)/n and simplified maximum likelihood decoding," IEEE Trans. Inform. Theory, vol. IT-25, pp.97-100, Jan. 1979.

Next, reference will be made to the conditions which should be considered when rate matching symbols channel-encoded with a systematic code (in the description below, the systematic code will be assumed to be a turbo code). Conditions 1B to 5B below are the conditions which should be considered when rate matching the encoded symbols by puncturing, and Conditions 1D to 5D are the conditions which should be considered when rate matching the encoded symbols by repeating.

Condition 1B: Since a turbo code is a systematic code, the portion corresponding to information symbols out of the symbols encoded by the encoder should not be punctured. Moreover, for the further reason that an iterative decoder is used as a decoder for the turbo code, the portion corresponding to the information symbols should not be punctured.

Condition 2B: Since a turbo encoder is comprised of two component encoders connected in parallel, it is preferable to maximize the minimum free distance of each of the two component encoders, for the minimum free distance of the whole code. Therefore, in order to obtain optimal performance, the output parity symbols of the two component encoders should be uniformly punctured.

Condition 3B: In most iterative decoders, since decoding is performed from the first internal decoder, the first output symbol of the first component decoder should not be punctured. In other words, the first symbol of an encoder should not be punctured regardless of whether it is a systematic or parity bits, because the first symbol indicates the starting point of encoding.

Condition 4B: The output parity symbols of each component encoder should be punctured using a uniform puncturing pattern such that the encoded symbols output from the encoder should be uniformly punctured, in the same manner as existing convolutional code systems.

Condition 5B: Termination tail bits used for the turbo encoder should not be punctured because of the detrimental effect on the performance of the decoder. For example, a SOVA (Soft Output Viterbi Algorithm) decoder has low performance when the termination tail bits are punctured, as compared with the case where the termination tail bits are not punctured.

Condition 1D: Since a turbo code is a systematic code, a portion corresponding to information symbols out of the symbols encoded by the encoder should be repeated to increase the energy of the symbols. Moreover, since an iterative decoder is used as a decoder for the turbo code, the portion corresponding to the information symbols should be frequently repeated.

Condition 2D: Since a turbo encoder is comprised of two component encoders connected in parallel, it is preferable to maximize the minimum free distance of each of the two component encoders, for the minimum free distance of the whole code. Therefore, when the parity symbols are repeated, the output parity symbols of the two component encoders should be uniformly repeated in order to obtain optimal performance.

Condition 3D: In most iterative decoders, since decoding is performed from the first internal decoder, the first output symbol of the first component decoder should be preferentially repeated when the parity symbols are repeated.

Condition 4D: The output parity symbols of each component encoder should be repeated using a uniform repetition pattern such that the encoded symbols output from the encoder should be uniformly repeated, in the same manner as existing convolutional code systems.

Condition 5D: Termination tail bits used for the turbo encoder should be repeated because of the effect on the performance of the decoder. For example, a SOVA (Soft Output Viterbi Algorithm) decoder has different performance according to whether the termination tail bits are repeated or not.

The present invention aims to implement a rate matching device which satisfies not only Conditions 1A-3A and 1C-2C but also Conditions 1B-5B and 1D-5D. That is, a rate matching device by puncturing according to the present invention serves as a rate matching device, which satisfies Conditions 1A to 3A, for convolutionally-encoded symbols, and also serves as a rate matching device, which satisfies Conditions 1B to 5B, for turbo-encoded symbols. The rate matching device by repeating according to the present invention serves as a rate matching device, which satisfies Conditions 1C to 2C, for convolutionally-encoded symbols, and also serves as a rate matching device, which satisfies Conditions 1D to 5D, for turbo-encoded symbols.

Fundamental Structure of the Rate Matching Device

Figure 2:
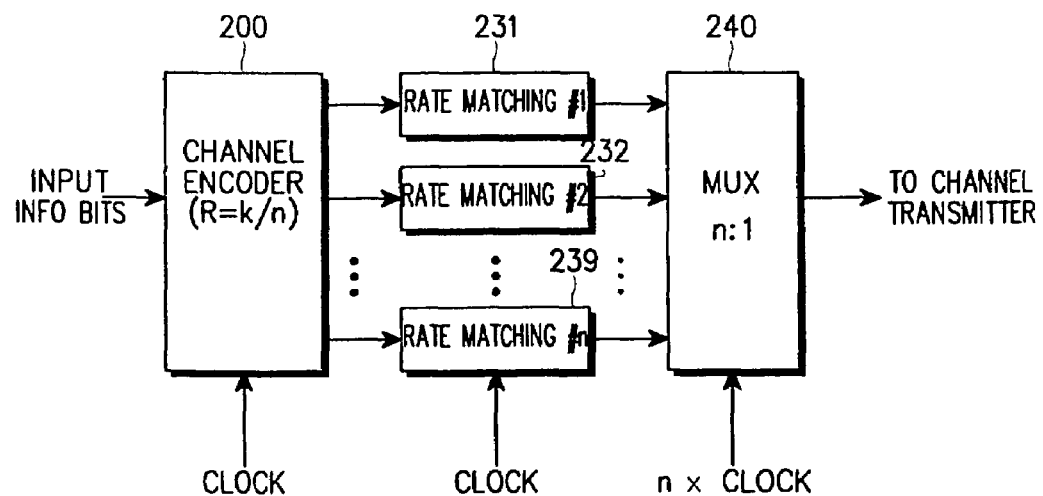
FIGS. 2 and 3 are diagrams illustrating structures of rate matching devices according to embodiments of the present invention.
Figure 3:
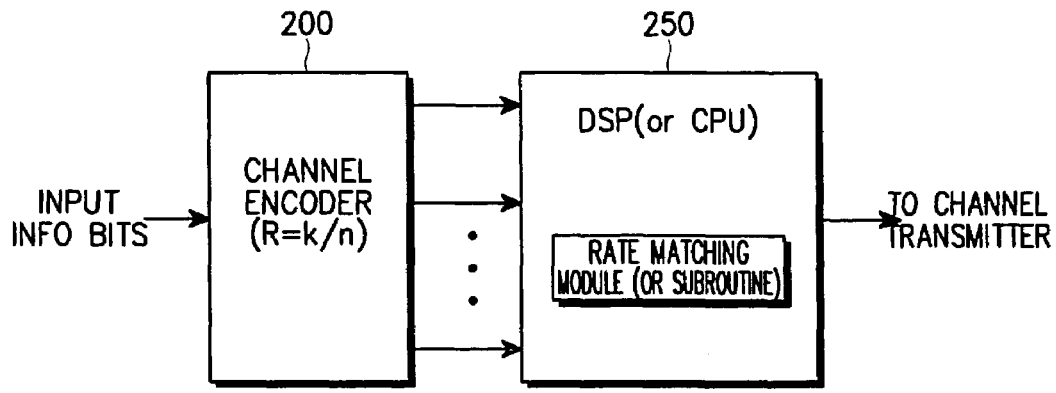

Embodiments of rate matching device structures according to the present invention are shown in FIGS. 2 and 3. More specifically, FIG. 2 shows an example of a rate matching device implemented in hardware according to an embodiment of the present invention, and FIG. 3 shows an example of a rate matching device implemented in software according to an embodiment of the present invention.

Referring to FIG. 2, a channel encoder 200 channel encodes input information bits at a coding rate $R=k/n$, and outputs encoded symbols. Here, n denotes the number of encoded symbols constituting one codeword, and k denotes the number of input information bits constituting one input information word. There are n rate matching blocks 231-239, each of which separately receive encoded symbols, output from the channel encoder 200, by a number of input symbols determined according to the coding rate, and puncture/repeat the received symbols. The n rate matching blocks 231-239 each separately receive the encoded symbols, output from the channel encoder 200, by the number determined by multiplying the number of the encoded symbols in a frame by the coding rate. For example, if the number of encoded symbols in one frame is 10 and the coding rate is $R=1/5$, the 5 rate matching blocks each separately receive 2 symbols. The rate matching blocks 231-239 each puncture the received symbols according to a predetermined puncturing pattern or repeat the received symbols according to a predetermined repeating pattern. A multiplexer 240 multiplexes the rate-matched symbols from the rate matching blocks 231-239, and outputs the multiplexed symbols to a channel transmitter (not shown). Since the channel transmitter is beyond the scope of the present invention, a detailed description of the channel transmitter will be avoided herein. The rate matching operation of the rate matching blocks 231-239 will become more apparent from the following detailed description of the preferred embodiments of the present invention.

Referring to FIG. 3, a channel encoder 200 channel encodes input information bits at a coding rate $R=k/n$, and outputs the encoded symbols. A digital signal processor (DSP) 250 having a rate matching module, performs rate matching (or puncturing/repeating) on the symbols channel-encoded by the channel encoder 200, using the rate matching module. The symbols rate-matched by the DSP 250 are output to the channel transmitter. The rate matching DSP 250 separately receives the encoded symbols of one frame from n separate data streams, where the number of symbols received from each stream equals the number of the input symbols determined according to the coding rate, and punctures/repeats the received symbols, in the same manner as shown in FIG. 2. In other words, although the DSP 250 is a single element in hardware, it performs the same rate matching operation as the n rate matching blocks of FIG. 2. The DSP 250 may also be implemented by a CPU (Central Processing Unit), and the rate matching operation may be implemented by a subroutine. When the term "rate matching blocks" is used herein, it is intended to refer to the rate matching modules in DSP 250 as well.

As shown in FIGS. 2 and 3, a rate matching device according to the present invention may have a structure that includes as many rate matching blocks as the number corresponding to the coding rate (i.e., a reciprocal of the coding rate when $k=1$, but if $k\neq1$ then the number of the rate matching blocks may be equal to a reciprocal of the coding rate multiplied by k), and each rate matching block receives as many symbols as the number determined by multiplying the number of the encoded symbols in a frame by the coding rate, and punctures the received symbols according to a predetermined puncturing pattern or repeats the received symbols according to a predetermined repetition pattern. This structure has the feature that the channel encoded symbols are separately processed, while the conventional rate matching device of FIG. 1 processes the channel-encoded symbols in a frame unit. The rate matching device modified according to the present invention can be used for both convolutional codes and turbo codes. That is, a rate matching device according to the present invention has a single structure that can be applied to both convolutional codes and turbo codes, even though two different sets of conditions are required.

Figure 8:
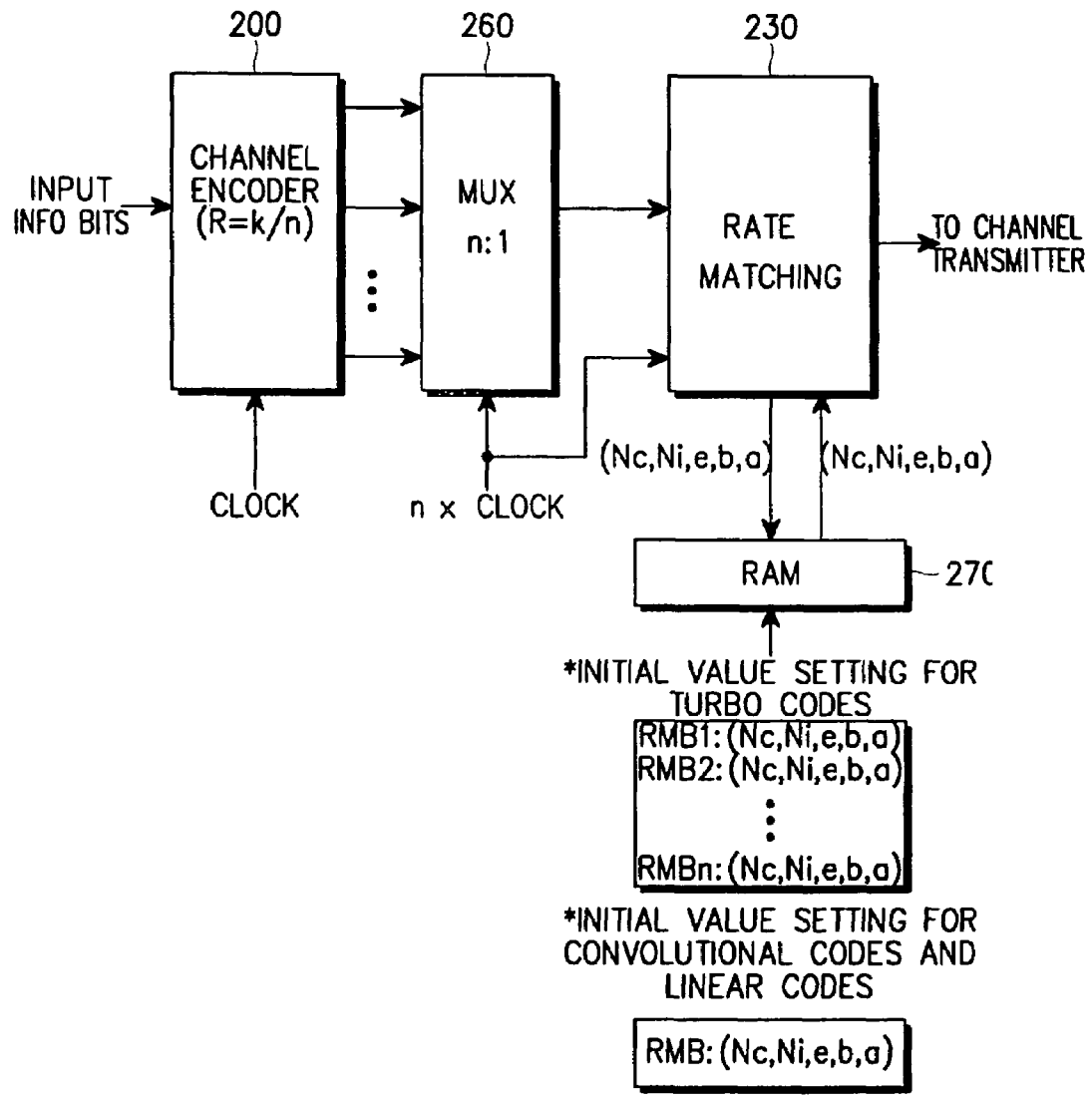
FIG. 8 is a diagram illustrating a structure of a rate matching device by puncturing according to further another embodiment of the present invention.

A rate matching device according to the present invention may also have a structure of FIG. 8. This rate matching device has a combined structure of the conventional rate matching device of FIG. 1 and the novel rate matching device of FIGS. 2 and 3. Including a single rate matching block, the rate matching device has a low complexity, even though implemented by hardware.

Referring to FIG. 8, a channel encoder 200 channel encodes input information bits at a coding rate $R=k/n$, and outputs the encoded symbols. The encoded symbols are multiplexed by a multiplexer 260, and the multiplexed encoded symbols are output to a rate matching block 230. The symbols rate-matched by the rate matching block 230 by puncturing/repeating are transmitted to a channel transmitter. A RAM (Random Access Memory) 270 stores an initial value received during rate matching performed by the rate matching block 230, and provides the initial value to the rate matching block 230. The channel encoder 200 operates at every period of the symbol clock having a speed of CLOCK, and the multiplexer 260 and the rate matching block 230 operate at a predetermined period of a clock having a speed of n×CLOCK. The initial value provided to the RAM 270 includes input symbol number Nc, output symbol number Ni, error value 'e', and puncturing/repeating pattern determining parameters 'a' and 'b'. The number of symbols to be punctured for every frame of the encoded symbols is determined by the input symbol number Nc and the output symbol number Ni. The RAM 270 stores input symbol number Nc corresponding to each symbol clock in a predetermined period, output symbol number Ni, error value 'e', and puncturing/repeating pattern determining parameters 'a' and 'b'. When rate matching is performed by puncturing, the rate matching block 230 receives the corresponding input symbol number Nc, output symbol number Ni, error value 'e', and puncturing pattern determining parameters 'a' and 'b', stored in the RAM 270, at every symbol clock period, to determine whether the particular symbol being processed at every symbol clock period needs to be punctured, and performs puncturing according to the corresponding puncturing pattern. When rate matching is performed by repeating, the rate matching block 230 receives the corresponding input symbol number Nc, output symbol number Ni, error value 'e', and repetition pattern determining parameters 'a' and 'b', stored in the RAM 270, at every symbol clock period, to determine whether the particular symbol being processed at every symbol clock period needs to be punctured, and performs repeating according to the corresponding repetition pattern.

When a convolutional code or a linear block code is used in the channel encoder 200, the initial value is set to a specific puncturing/repeating parameter (Nc,Ni,e,b,a) in the RAM 270. That is, the rate matching block (RMB) 230 operates as shown in FIG. 1, without updating the RAM 270.

When a turbo code is used in the channel encoder 200, the rate matching block 230 should sequentially operate from RMB1 to RMBn (each RMBx [x=1 to n] is associated with a set of values for Nc, Ni, e, b and a) at every symbol clock period designated as period 'n' (i.e., period n=the period of a clock having a speed of CLOCK). In other words, at every period of a clock having the speed of n×CLOCK, the rate matching block 230 is updated with the values for Nc, Ni, e, a and b from one of the RMBx [x=1 to n]. Thus, for every period of n, the rate matching block 230 is updated with the values for Nc, Ni, e, b and a from each of the RMBx. For example, during one period of 1/(n×CLOCK), the rate matching block 230 may receive the values for Nc, Ni, e, a and b from RMB1 and then receive the values for Nc, Ni, e, a and b from RMB2 on the next period of 1/(n×CLOCK) and so on, until the values from RMBn are received by the rate matching block 230. The same cycle is then again repeated in next period 'n'. Therefore, state values of RMBx processed at a certain time point, i.e., the parameter values (Nc,Ni,e,b,a) for determining the symbols and the patterns for puncturing/repeating, are stored in the RAM 270 for the process at the next time point. Therefore, if this value is used when the RMBx is processed again next time, it is possible to perform operation of n RMBs (RMB1-RMBn) using a single RMB. For a processing rate, since n×CLOCK is used as shown in FIGS. 1 and 2, the complexity will not be increased.

Meanwhile, in FIG. 2, the rate matching blocks 231-239 each separately receive as many symbols encoded by the channel encoder 200 as the number determined by multiplying the number of encoded symbols in a frame by the coding rate. However, it should be noted that each of the rate matching blocks 231-239 can also separately receive a different number of the symbols encoded by the channel encoder 200. For example, one of the rate matching blocks 231-239 could separately receive a number of encoded symbols which is smaller than the number determined by multiplying the number of the encoded symbols in a frame by the coding rate, and another rate matching block could separately receive a number of encoded symbols which is larger than the number determined by multiplying the number of the encoded symbols in a frame by the coding rate. However, for simplicity, we will describe a case where each of the rate matching blocks 231-239 separately receive the same number of symbols encoded by the channel encoder 200.

Embodiments of the Rate Matching Device

A description will now be made of the rate matching device according to an embodiment of the present invention. Herein, for convenience, the description will be made on the assumption that the coding rate is R=⅓ and 3 rate matching blocks are provided. However, it should be noted that the rate matching device according to the present invention applies to any case where there are n rate matching blocks, i.e., the coding rate is R=k/n. Further, in the description below, Ncs indicates the total number of the encoded symbols included in one frame, output from the channel encoder. Nc indicates the number of symbols input into each rate matching block, and the number of the input symbols is determined as Nc=R×Ncs. In the following description, R×Ncs=⅓×Ncs=Ncs/3. Ni indicates the number of symbols output from each rate matching block, and the number of output symbols is determined as Ni=R×Nis, which is Nis/3 in the description, where Nis indicates the total number of the symbols output after rate matching process. That is, Nis is the total number of the symbols output from the respective rate matching blocks. Therefore, the number of symbols (bits) to be punctured/repeated by each rate matching block is determined by y=Nc−Ni. The Nc value and Ni value can vary.

Further, the invention uses the parameters 'a' and 'b', which are integers determined according to a puncturing/repetition pattern within one frame, i.e., integers for determining the puncturing/repetition pattern. The parameter 'a' is an offset value for determining the position of the first symbol in the puncturing/repetition pattern. That is, the parameter 'a' determines which one of the encoded symbols included in one frame is to be taken as the first symbol of the puncturing/repetition pattern. If a value of the parameter 'a' increases, a symbol located at the front of the frame will be punctured/repeated. The parameter 'b' is a value for controlling the puncturing or repeating period in the frame. By varying this parameter value, it is possible to puncture/repeat all the encoded symbols included in the frame.

As described above, a rate matching device according to the present invention can perform rate matching not only by puncturing but also by repeating. The description of a rate matching device according to the present invention is divided into a device for performing rate matching by puncturing and a device for performing rate matching by repeating.

A. Embodiments of the Rate Matching Device by Puncturing

1. Embodiment of the Rate Matching Device by Puncturing (for a Convolutional Code)

Figure 4:
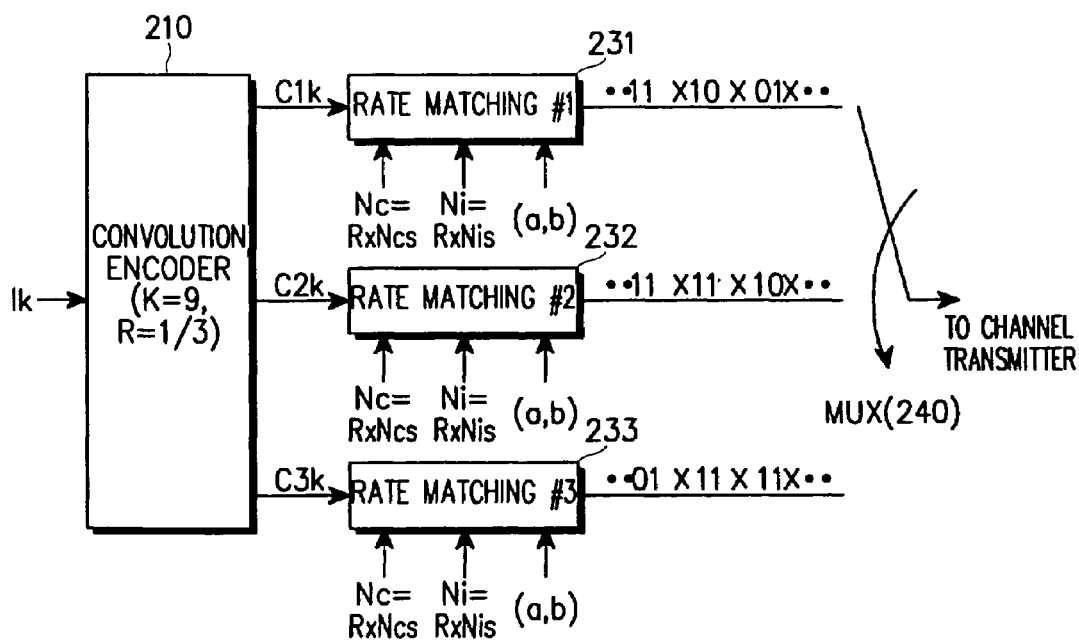
FIG. 4 is a diagram illustrating a structure of a rate matching device by puncturing according to an embodiment of the present invention.

FIG. 4 shows the structure of a rate matching device by puncturing according to an embodiment of the present invention. This structure is used when the rate matching devices of FIG. 2 and 3 rate match convolutional-encoded symbols by puncturing.

Referring to FIG. 4, a convolutional encoder 210 encodes input information bits Ik at a coding rate R=⅓, and outputs encoded symbols $C1k$, $C2k$ and $C3k$. The encoded symbols $C1k$, $C2k$, and $C3k$ are separately provided to rate matching blocks 231, 232 and 233, respectively. The first rate matching block 231 punctures the encoded symbol $C1k$. At this point, the puncturing process is performed based on the number of punctured symbols y=Nc−Ni, which is determined by the input symbol number Nc and the output symbol number Ni, and the puncturing pattern determining parameters 'a' and 'b'. For example, the first rate matching block 231 can output the symbols of '. . . 11x10x01x . . . ' (where x indicates a punctured symbol). The second rate matching block 232 punctures the encoded symbol $C2k$. At this point, the puncturing process is performed based on the punctured symbol number y=Nc−Ni, which is determined by the input symbol number Nc and the output symbol number Ni, and the puncturing pattern determining parameters 'a' and 'b'. For example, the second rate matching block 232 can output the symbols of '. . . 11x11x10x . . . ' (where x indicates a punctured symbol). The third rate matching block 233 punctures the encoded symbol $C3k$. At this point, the puncturing process is performed based on the punctured symbol number y=Nc−Ni, which is determined by the input symbol number Nc and the output symbol number Ni, and the puncturing pattern determining parameters 'a' and 'b'. For example, the third rate matching block 233 can output the symbols of '. . . 01x11x11x . . . ' (where x indicates a punctured symbol). The encoded symbols rate-matched by the rate matching blocks 231, 232 and 233 are multiplexed by a multiplexer 240 (not shown in FIG. 4) and provided to a channel transmitter.

In FIG. 4, the input symbol number Nc and the output symbol number Ni are equally determined as Nc=R×Ncs and Ni=R×Nis, respectively, for every rate matching block. Each rate matching block separately punctures the same number of the channel-encoded symbols, on the assumption that the error sensitivity of encoded symbols is almost the same for every symbol in one frame. That is, an almost uniform puncturing pattern is provided within one frame regardless of the various punctured bit numbers determined according to the service type. This is because it is possible that all of the symbols in one frame can be uniformly punctured for the convolution code.

Therefore, in accordance with an embodiment of the present invention, the symbols encoded by the convolution encoder 210 are separated and provided in the same number to the rate matching blocks 231, 232 and 233. The rate matching blocks 321, 232 and 233 each puncture the same number of the input symbols. At this point, the puncturing pattern parameters can be determined either equally or differently. That is, the puncturing patterns can be determined either equally or differently for the rate matching blocks 231, 232 and 233.

2. Another Embodiment of the Rate Matching Device by Puncturing (for Turbo Code)

Figure 5:
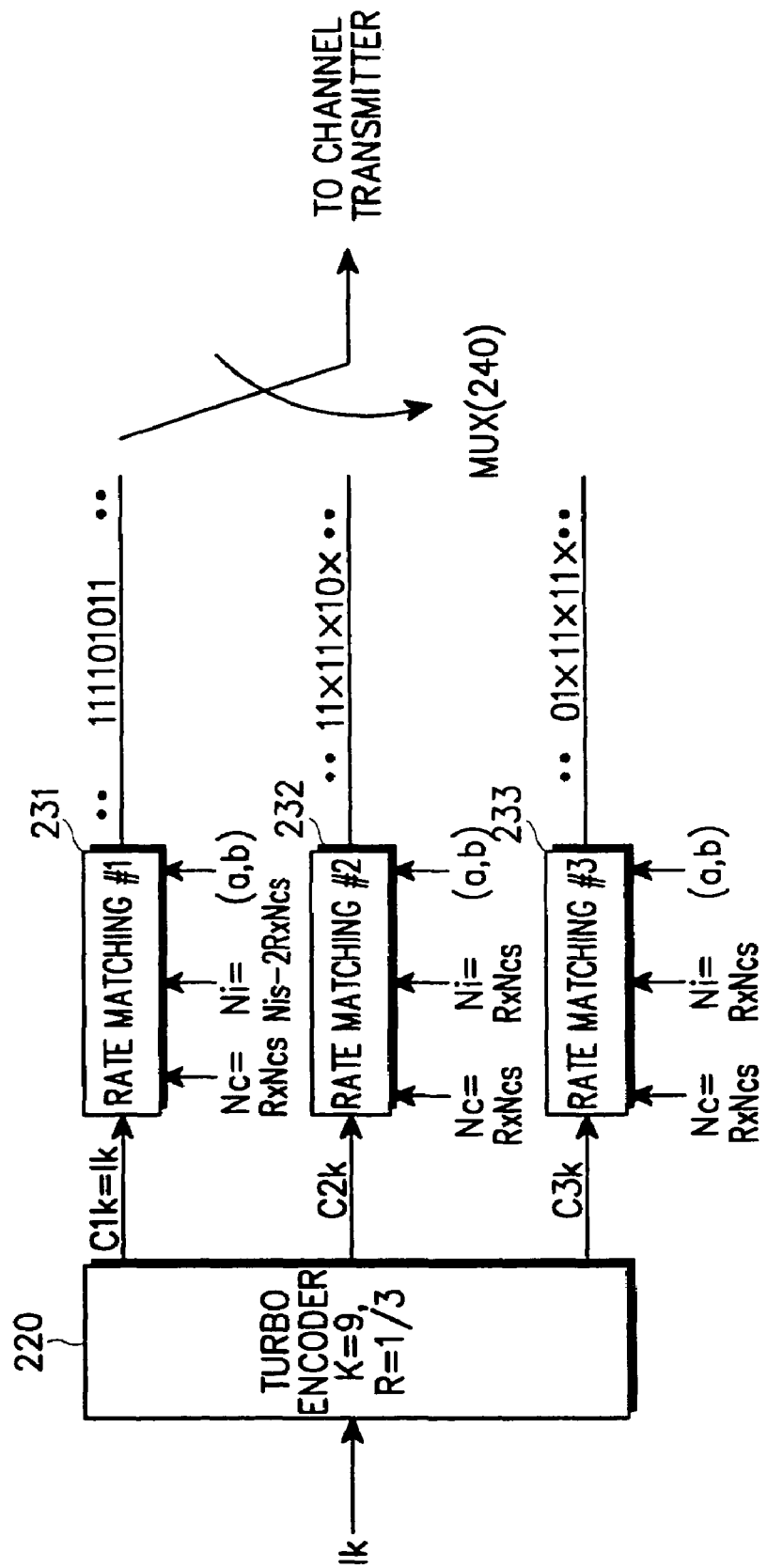
FIG. 5 is a diagram illustrating a structure of a rate matching device by puncturing according to another embodiment of the present invention.

FIG. 5 shows a structure of a rate matching device by puncturing according to another embodiment of the present invention. This structure is used when the rate matching devices of FIG. 2 and 3 rate match the turbo-encoded symbols by puncturing.

Figure 6:
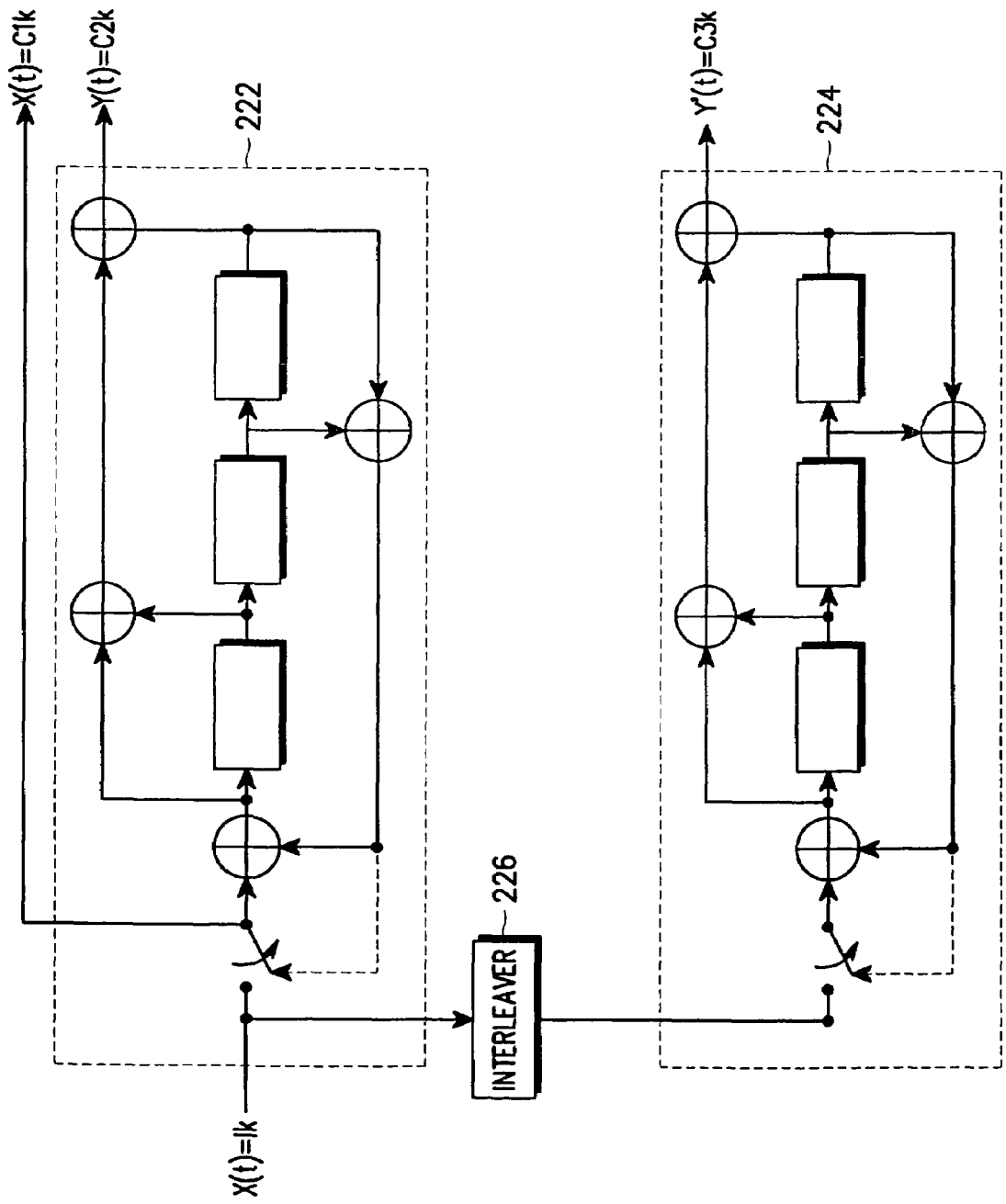
FIG. 6 is a detailed diagram illustrating a structure of the turbo encoder shown in FIG. 5.

Referring to FIG. 5, a turbo encoder 220 encodes input information bits Ik at a coding rate R=⅓, and outputs encoded symbols $C1k$, $C2k$ and $C3k$. Among the encoded symbols, the information symbol $C1k$ is separately provided to a first rate matching block 231, and the parity symbols (or redundancy symbols) $C2k$ and $C3k$ are separately provided to second and third rate matching blocks 232 and 233, respectively. The turbo encoder 220 is comprised of a first component encoder 222, a second component encoder 224 and an interleaver 226, as shown in FIG. 6. The structure of the turbo encoder 220 is well known by those skilled in the art. Thus, a detailed description will be avoided. The input X(t) to the turbo encoder 220 corresponds to the input information bits Ik shown in FIG. 5. Outputs X(t), Y(t) and Y'(t) of the turbo encoder 220 correspond to the encoded symbols $C1k$, $C2k$ and $C3k$ shown in FIG. 5, respectively. For the first output of the turbo encoder 220, the input information bits Ik=X(t) are output at as they are, so that, in FIG. 5, the input information bits Ik are output as $C1k$.

The first rate matching block 231 punctures the encoded symbols $C1k$ based on the following criteria. Since the coding rate is R=⅓, the input symbol number Nc is determined as Nc=R×Ncs=Ncs/3, which is ⅓ the total number of encoded symbols. The output symbol number Ni is also determined as Ni=R×Ncs, because puncturing is not performed on the portion corresponding to the information symbols according to Condition 1B. The puncturing pattern determining parameters 'a' and 'b' can be set to any integer because they are not used, since puncturing is not performed according to Condition 1B. For example, the first rate matching block 231 may output the symbols of '. . . 111101011 . . . '.

The second rate matching block 232 punctures the encoded symbols $C2k$ based on the following criteria. Since the coding rate is R=⅓, the input symbol number Nc is determined as Nc=R×Ncs=Ncs/3, which is ⅓ the total number of encoded symbols. Because the output parity symbols of the two component decoders should be uniformly punctured according to Condition 2B and Condition 4B, and the total output symbol number after puncturing is Nis for the total input symbols (Ncs) in one frame, the number Ni of symbols output from the second rate matching block 232 after puncturing is Ni=[Nis−(R×Ncs)]/2. If Ni=[Nis−(R×Ncs)]/2 is an odd number, the output symbol number becomes Ni=[Nis−(R×Ncs)+1]/2 or [Nis−(R×Ncs)−1]/2. One of the two values is selected according to the relationship between the second rate matching block 232 and the third rate matching block 233. That is, when the output symbol number of the second rate matching block 232 is determined as [Nis−(R×Ncs)+1]/2, the output symbol number of the third rate matching block 233 is determined as [Nis−(R×Ncs)−1]/2. On the contrary, when the output symbol number of the second rate matching block 232 is determined as [Nis−(R×Ncs)−1]/2, the output symbol number of the third rate matching block 233 is determined as [Nis−(R×Ncs)+1]/2.

The puncturing pattern determining parameters 'a' and 'b' can be selected as integers according to a desired puncturing pattern. These integers are determined according to the puncturing pattern only, and the parameters can be set to b=1 and a=2. A detailed description of a method for determining the integers for the puncturing pattern determining parameters will be made with reference to the tables which are given below. For example, the second rate matching block 232 may output the symbols of '... 11x11x10x...' (where x indicates a punctured symbol).

The third rate matching block 233 punctures the encoded symbols C3$k$ based on the following criteria. Since the coding rate is R=⅓, the input symbol number Nc is determined as Nc=R×Ncs=Ncs/3, which is ⅓ the total number of input symbols(encoded symbols). Because the total output parity symbols of the two component decoders should be uniformly punctured according to Condition 2B and Condition 4B, and the total output symbol number after puncturing is Nis for the total input symbols in one frame, the number Ni of the symbols output from the second rate matching block 232 after puncturing is Ni=[Nis−(R×Ncs)]/2. If Ni=Nis−(R×Ncs) is an odd number, the output symbol number becomes Ni=[Nis−(R×Ncs)+1]/2 or [Nis−(R×Ncs)−1]/2. One of the two values is selected according to the relationship between the second rate matching block 232 and the third rate matching block 233. That is, when the output symbol number of the second rate matching block 232 is determined as [Nis−(R×Ncs)+1]/2, the number of output symbols of the third rate matching block 233 is determined as [Nis−(R×Ncs)−1]/2. On the contrary, when the output symbol number of the second rate matching block 232 is determined as [Nis−(R×Ncs)−1]/2, the output symbol number of the third rate matching block 233 is determined as [Nis−(R×Ncs)+1]/2.

The puncturing pattern determining parameters 'a' and 'b' can be selected as integers according to a desired puncturing pattern. These integers are determined according to the puncturing pattern only, and the parameters can be set to b=1 and a=2. A detailed description of a method for determining the number of symbols (excepting the rate matching block 231 of FIG. 5). However, the rate matching blocks may puncture different numbers of symbols. If the number Ni of the symbols output from the respective rate matching blocks is set differently, the number of symbols punctured by the respective rate matching blocks will be determined differently. Further, the pattern of the symbols punctured by the respective rate matching blocks can be determined either equally or differently, by changing the puncturing pattern determining parameters 'a' and 'b'. That is, even though it has a single structure, a rate matching device according to the present invention can determine parameters such as the input symbol number, the output symbol number, the number of symbols to be punctured and the puncturing pattern determining parameters differently. Table 1 below shows various cases of the parameters, by way of example. Herein, the coding rate is assumed to be R=⅓. Therefore, three rate matching blocks are provided, and the respective rate matching blocks separately receive the same number of symbols, i.e., Nc=Ncs/3 symbols. Herein, the rate matching blocks separately receive the same number of the symbols, determined by multiplying the number of the encoded symbols by the coding rate. However, it should be noted that the present invention can also be applied to a case where the rate matching blocks separately receive a different number of symbols, i.e., a number of symbols which is smaller than the number determined by multiplying the number of the encoded symbols in a frame by the coding rate, or a number of symbols which is larger than the number determined by multiplying the number of the encoded symbols in a frame by the coding rate. In the description below, RMB1, RMB2 and RMB3 denote first to third rate matching blocks, respectively.

TABLE 1

| | RMB1 | | | | RMB2 | | | | RMB3 | | | |
|---|---|---|---|---|---|---|---|---|---|---|---|---|
| Case | Nc | Ni | a | b | Nc | Ni | a | b | Nc | Ni | a | B |
| 1 | Ncs/3 | Nis/3 | p | q | Ncs/3 | Nis/3 | p | q | Ncs/3 | Nis/3 | p | Q |
| 2 | Ncs/3 | Nis/3 | p | q | Ncs/3 | Nis/3 | r | s | Ncs/3 | Nis/3 | t | W |
| 3 | Ncs/3 | Nis/3 | NA | NA | Ncs/3 | (Nis − R * Ncs)/2 | 2 | 1 | Ncs/3 | (Nis − R * Ncs)/2 | 2 | 1 |
| 4 | Ncs/3 | Nis/3 | NA | NA | Ncs/3 | (Nis − R * Ncs)/2 | 2 | 1 | Ncs/3 | (Nis − R * Ncs)/2 | 5 | 1 |
| 5 | Ncs/3 | Nis/3 | NA | NA | Ncs/3 | (Nis − R * Ncs)/2 | p | 1 | Ncs/3 | (Nis − R * Ncs)/2 | p | 1 |
| 6 | Ncs/3 | Nis/3 | NA | NA | Ncs/3 | (Nis − R * Ncs)/2 | p | 1 | Ncs/3 | (Nis − R * Ncs)/2 | q | 1 |
| 7 | Ncs/3 | Nis/3 | NA | NA | Ncs/3 | (Nis − R * Ncs)/2 | p | q | Ncs/3 | (Nis − R * Ncs)/2 | p | Q |
| 8 | Ncs/3 | Nis/3 | NA | NA | Ncs/3 | (Nis − R * Ncs)/2 | p | q | Ncs/3 | (Nis − R * Ncs)/2 | r | S |
| 9 | Ncs/3 | Nis/p | s | 1 | Ncs/3 | Nis/q | t | 1 | Ncs/3 | Nis/r | w | 1 |
| 10 | Ncs/3 | Nis/p | s | x | Ncs/3 | Nis/q | t | y | Ncs/3 | Nis/r | w | Z | integers for the puncturing pattern determining parameters will be made with reference to the tables which are given below. For example, the third rate matching block 233 may output the symbols of '... 01x11x11x...' (where x indicates a punctured symbol).

In FIG. 5, the symbols encoded by the turbo encoder 220 are separated and then provided in equal numbers to the rate matching blocks 231, 232 and 233. The first rate matching block 231 outputs the input symbols, as they are. The second and third rate matching blocks 232 and 233 puncture the same number of input symbols. At this point, the puncturing patterns may be determined either equally or differently. That is, the puncturing patterns may be determined either equally or differently for the rate matching blocks 232 and 233.

3. Determination of Parameters for Puncturing

In the preferred embodiments of the present invention discussed here, the rate matching blocks puncture the same In Table 1, RMB1, RMB2 and RMB3 indicates rate matching blocks, and p, q, r, s, t, w, x, y and z are integers. In Case 9 and Case 10, $$\left(\frac{1}{p} + \frac{1}{q} + \frac{1}{r}\right) = 1.0.$$

This is because $$Nis\left(\frac{1}{p} + \frac{1}{q} + \frac{1}{t}\right) = Nis.$$

NA (Not Available) indicates that the input symbols are output as they are, without puncturing, for which the parameters 'a' and 'b' can be set to any value. Here, the parameters 'a' and 'b' are positive numbers. Further, the case where the input symbols are punctured to perform rate matching so that the number of the input symbols is larger than the number of the output symbols (i.e., Ncs>Nis) is shown. Reference will be made to each Case.

Case 1, Case 2: In Case 1 and Case 2, the symbols in one frame are punctured in a uniform pattern. Specifically, in Case 1, the rate matching blocks have the same puncturing pattern because the "a" and "b" parameters are the same, and in Case 2, the rate matching blocks have different puncturing patterns because the "a" and "b" parameters are different.

Case 3: In systematic puncturing, information symbols are not punctured, but the parity symbols are punctured. Here, since the puncturing pattern determining parameter values 'a' and 'b' are equal to each other, RMB2 and RMB3 perform uniform puncturing half-and-half using the same puncturing pattern.

Case 4: In systematic puncturing, information symbols are not punctured, and the parity symbols are punctured. Here, since the puncturing pattern determining parameters 'a' and 'b' are different from each other, RMB2 and RMB3 perform uniform puncturing half-and-half using different puncturing patterns.

Case 5: This is a general case for Case 3. In this case, the puncturing pattern determining parameter 'a' is set to an integer 'p' so that it may be possible to set the various puncturing patterns. The parameter 'a' is set to the same value for both RMB2 and RMB3.

Case 6: This is a general case for Case 4. In this case, the puncturing pattern determining parameter 'a' is set to integers 'p' and 'q' so that it may be possible to set the various puncturing patterns. The parameter 'a' is set to 'p' for RMB2 and 'q' for RMB3.

Case 7: This is a further general case for Case 5. In this case, the puncturing pattern determining parameter 'a' is set to an integer 'p' and the puncturing pattern determining parameter 'b' is set to an integer 'q' so that it may be possible to set the various puncturing patterns. The parameters 'a' and 'b' are set to the same value for both RMB2 and RMB3.

Case 8: This is a further general case for Case 6. In this case, the puncturing pattern determining parameter 'a' is set to integers 'p' and 'r' for RMB2 and RMB3, respectively, and the puncturing pattern determining parameter 'b' is set to integers 'q' and 's' for RMB2 and RMB3, respectively, so that it may be possible to set various puncturing patterns. The parameters 'a' and 'b' are set to 'p' and 'q' for RMB2 and to 'r' and 's' for RMB3.

Case 9, Case 10: In these cases, all the possible parameters are changed. That is, the output symbol number can be set to any integer and the puncturing pattern determining parameters 'a' and 'b' can also be set to any given integers.

In Table 1, Case 1 and Case 2 can be applied when rate matching is performed on the convolutionally-encoded symbols, and Case 3 to Case 8 can be applied when rate matching is performed on the turbo-encoded symbols.

The puncturing pattern may be varied according to a change in the puncturing pattern determining parameter 'a'. Table 2 below shows a variation of the puncturing patterns according to a change in the parameter 'a'. It is assumed in Table 2 that Nc=10, Ni=8, y=Nc−Ni=10−8=2, and b=1. The symbols punctured according to the puncturing pattern are represented by 'x'.

TABLE 2

| Case | a | Input | Output |
|---|---|---|---|
| Case 1 | 1 | 1 2 3 4 5 6 7 8 9 10 | 1 2 3 4 x 6 7 8 9 x |
| Case 2 | 2 | 1 2 3 4 5 6 7 8 9 10 | 1 2 3 x 5 6 7 x 9 10 |
| Case 3 | 5 | 1 2 3 4 5 6 7 8 9 10 | x 2 3 4 5 x 7 8 9 10 |
| Case 4 | 10 | 1 2 3 4 5 6 7 8 9 10 | x 2 3 4 5 6 x 8 9 10 |
| Case 5 | 100 | 1 2 3 4 5 6 7 8 9 10 | x 2 3 4 5 6 x 8 9 10 |

It is noted from Table 2 that it is possible to obtain the different puncturing patterns by fixing 'b' to '1' and setting 'a' to different values. It can be understood that the first symbol of the puncturing pattern is located in front, as the 'a' value is increased. Of course, it is possible to obtain more various puncturing patterns by changing the parameter 'b' as well. In addition, it is possible to prevent the first symbol from being punctured by setting the parameter 'b' to 1 and using a value satisfying Equation 1 below for the parameter 'a'. Therefore, to satisfy Condition 3B, the parameter 'a' should be set to a value within a range of Equation 1.

$$1 \leq a < \lfloor Nc/y \rfloor \quad (1)$$

where $\lfloor Nc/y \rfloor$ is the largest integer less than or equal to Nc/y.

In Equation 1, for Nc=10 and y=2, Nc/y=10/2=5. Therefore, if 'a' has a value of 1, 2, 3 and 4, the first symbols will not be punctured.

In order to satisfy Condition 5B, the tail bits should not be punctured. To this end, Nc should be set to a value determined by subtracting the number of the tail bits therefrom. That is, if the input symbol number Nc is set to Nc−NT where NT denotes the number of tail bits, the tail bits will not be punctured, thus satisfying Condition 5B. In other words, the tail bits do not enter the rate matching block. Thus, the rate matching pattern only considers a frame size of Nc−NT. After puncturing or repeating by the rate matching block, the tail bits are concatenated sequentially to the output symbols of the rate matching block. The tail bits are not processed and are only attached at the end of the output symbols.

4. Rate Matching Algorithm by Puncturing

Figure 7:
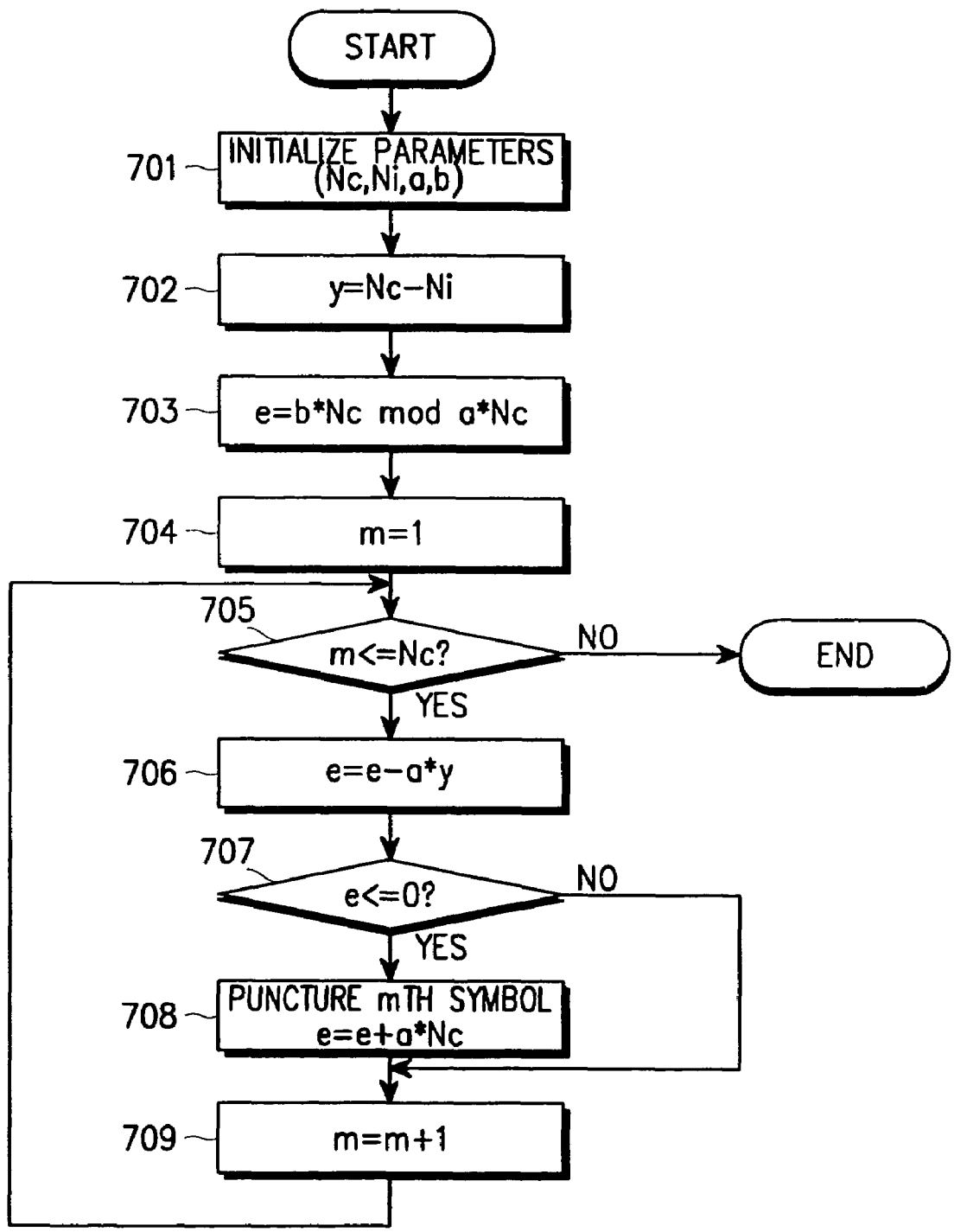
FIG. 7 is a flow chart illustrating a rate matching procedure by puncturing according to an embodiment of the present invention.

FIG. 7 shows a rate matching procedure by puncturing according to an embodiment of the present invention. This procedure is performed based on a rate matching algorithm shown in Table 3 below. In Table 3, "So={d1,d2, ..., dNc}" denotes the symbols input for one rate matching block, i.e., the symbols input in a frame unit for one rate matching block, and is comprised of Nc symbols in total. A shift parameter S(k) is an initial value used in the algorithm, and is constantly set to '0' when a rate matching device according to the present invention is used in a downlink of a digital communication system (i.e., when rate matching is performed on the encoded symbols to be transmitted from the base station to the mobile station). 'm' indicates the order of the symbols input for rate matching, and has the order of 1, 2, 3, . . . , Nc. It is noted from Table 3 that the parameters including the input symbol number Nc, the output symbol number Ni and the puncturing pattern determining parameters 'a' and 'b' can be changed. For example, the parameters can be changed as shown in Table 1. The input symbol number Nc can be determined as a value other than Ncs/3, according to the coding rate R. FIG. 7 corresponds to the case where the algorithm of Table 3 is applied to a downlink of the digital communication system, i.e., S(k)=0.

TABLE 3

```
Let's denote:
    So = {d1,d2,...,dNc} = set of Nc data bits
The rate matching rule is as follows:
if puncturing is to be performed
    y = Nc−Ni
    e = (2*S(k)*y + bNc) mod aNc
        → initial error between current and desired puncturing ratio (downlink: S=0)
    if e = 0 then e = aNc
    m = 1           → index of current bit
    do while m <= Nc
        e = e − a*y          → update error
        if e <= 0 then       → check if bit number m should be punctured
            puncture bit m from set So
            e = e + a*Nc     → update error
        end if
        m = m + 1            → next bit
    end do
```

When the algorithm of Table 3 is used, the following advantages are provided.

First, it is possible to variably puncture the encoded symbols of a frame unit.

parameters (let Initial_Offset_m=the position of the first symbol to be punctured). In the above algorithm, Initial_Offset_m ='m' when 'e'≦0 for the first time. Table 3A below shows an example of determining Initial_Offset_m. In the example below, bNc is assumed to be smaller than aNc.

TABLE 3A

|  | m = 1 | m = 2 | m = 3 | m = 4 = k | ... ...m = Nc |
|---|---|---|---|---|---|
| initially, e = bNc | bNC-ay ≧ 0 | bNc-2ay ≧ 0 | bNc-3ay ≧ 0 | bNc-4ay < 0 | ... |
| puncturing or repetition | None | None | None | Puncturing or Repetition | ... |

Second, it is possible to generate various puncturing patterns by adjusting the parameters Nc, Ni, a and b.

Third, it is possible to reduce the complexity and calculating time of each rate matching block by 1/R. This is because if a plurality of rate matching blocks are used, the number of the symbols to be punctured by each rate matching block will be reduced, as compared with the case where one rate matching block is used.

Referring to FIG. 7, in step 701, all sorts of parameters including the input symbol number Nc, the output symbol number Ni and the puncturing pattern determining parameters 'a' and 'b' are initialized for the rate matching process. When Nc and Ni are determined by parameter initialization, the number of symbols to be punctured is determined by y=Nc−Ni, in step 702. In step 703, an initial error value 'e' between current and desired puncturing ratios is calculated. The initial error value is determined by e=b*Nc mod a*Nc.

Next, in step 704, 'm' indicating the order of the input symbols is set to '1' (m=1). Thereafter, in steps 705 to 709, the symbols are examined from the initial symbol as to whether they should be punctured or not. If it is determined in step 707 that the calculated error value 'e' is smaller than or equal to '0', the corresponding symbol is punctured and then the error value is updated by e=e+a*Nc, in step 708. Otherwise, if it is determined in step 707 that the calculated error value 'e' is larger than '0', puncturing is not performed. The operation of receiving the encoded symbols in order, determining whether to perform puncturing on the received symbols, and performing puncturing accordingly, is repeatedly performed until it is determined in step 705 that all the symbols in one frame are completely received.

As shown by the algorithm above, the position of the first symbol to be punctured or repeated is controlled by the (a,b)

Initial Offset_m=k=4

In the equations below, Ppnc signifies the period of puncturing or repeating in the above algorithm.

Initial_Offset_m=⌈bNc/ay⌉=⌈(b/a)*(Nc/y)⌉=⌈(b/a)*Ppnc⌉

$$Ppnc = \lceil Nc/y \rceil \quad \text{if } Nc/y \text{ is an integer}$$

$$= \lceil Nc/y \rceil \pm 1 \quad \text{if } Nc/y \text{ is not an integer}$$

As shown by the above equations, by controlling the (a,b) parameters, the position of the first symbol to be punctured or repeated can be controlled.

For example, the value of Initial_Offset_m decreases as 'a' increases if 'b' stays constant. Thus, by increasing 'a', the position of the first symbol to be punctured/repeated will be pushed closer to the first position. If 'a' is chosen to be bigger than by/Nc, then Initial_Offset_m=1, which means that the first symbol will be punctured or repeated. As a result, the position of the first symbol to be punctured/repeated can be manipulated by choosing a value for 'a' between 1 and Ppnc. For example, if 'b'=1 and 'a'=2, the position of the first symbol to be punctured/repeated will be always equal to Ppnc/2.

As for the 'b' parameter, it controls the Initial_Offset_m along with 'a', and, as shown below, once the value of 'a' has been decided, the value of 'b' can be expressed as 1≦b≦a. If 'a' stays constant, Initial_Offset_m will increase if 'b' increases and will decrease if 'b' decreases. Thus, the puncturing/repeating positions can be controlled by manipulating the values of (a,b) parameters. Although the value of 'b' can be anything, it is not meaningful to choose a value of 'b' greater than 'a', as shown below, because the initial value of 'e' becomes cyclical once the value of 'b' becomes larger than 'a' (i.e., the value of 'e' repeats itself).

Let a=3;
the initial value of e=(2*S(k)*y+bNc) mod aNc;
e=bNc mod aNc since S(k)=0 in downlink;
if b=1 then e=Nc;
if b=2 then e=2 Nc;
if b=3 then e=3 Nc;
if b=4 then e=Nc;
if b=5 then e=2 Nc;
if b=6 then e=3 Nc;

As shown by the above example, the initial value of 'e' changes as the value of 'b' changes. However, once the value of 'b' becomes larger than 'a', the initial value of 'e' repeats itself cyclically. Thus, it is not meaningful to assign a value bigger than 'a' to 'b'. In conclusion, the puncturing or repetition pattern can be controlled by manipulating the (a,b) parameters.

B. Embodiments of the Rate Matching Device by Repeating

1. Embodiment of the Rate-Matching Device by Repeating (for a Convolutional Code)

Figure 9:
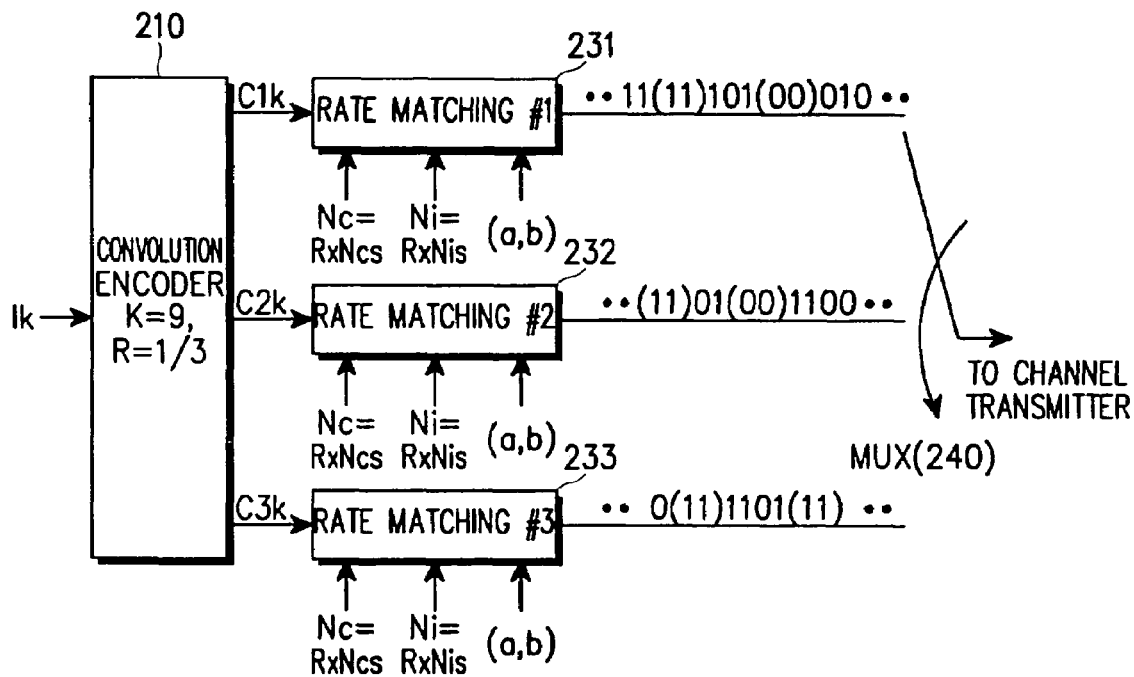
FIG. 9 is a diagram illustrating a structure of a rate matching device by repeating according to an embodiment of the present invention.

FIG. 9 shows a structure of a rate matching device by repeating according to an embodiment of the present invention. This structure is used when the rate matching devices of FIG. 2 and 3 rate match convolutionally-encoded symbols by repeating.

Referring to FIG. 9, a convolutional encoder 210 encodes input information bits Ik at a coding rate R=⅓, and outputs encoded symbols C1k, C2k and C3k. The encoded symbols C1k, C2k, and C3k are separately provided to rate matching blocks 231, 232 and 233, respectively. The first rate matching block 231 selectively repeats the encoded symbol C1k. At this point, the repeating process is performed based on the repetition symbol number y=Ni−Nc determined by the input symbol number Nc and the output symbol number Ni, and the repetition pattern determining parameters 'a' and 'b'. For example, the first rate matching block 231 can output the symbols of ' . . . 11(11)101(00)010 . . . ' (where (11) and (00) indicate repeated symbols).

The second rate matching block 232 selectively repeats the encoded symbol C2k. At this point, the repeating process is performed based on the repetition symbol number y=Ni−Nc determined by the input symbol number Nc and the output symbol number Ni, and the repetition pattern determining parameters 'a' and 'b'. For example, the second rate matching block 232 can output the symbols of ' . . . (11)01 (00)1100 . . . ' (where (11) and (00) indicate repeated symbols).

The third rate matching block 233 repeats the encoded symbol C3k. At this point, the repeating process is performed based on the repetition symbol number y=Ni−Nc determined by the input symbol number Nc and the output symbol number Ni, and the repetition pattern determining parameters 'a' and 'b'. For example, the third rate matching block 233 can output the symbols of ' . . . 0(11)1101(11) . . . ' (where (11) indicates repeated symbols). The encoded symbols rate-matched by the rate matching blocks 231, 232 and 233 are multiplexed by a multiplexer 240 and provided to a channel transmitter.

In FIG. 9, the input symbol number Nc and the output symbol number Ni are equally determined as Nc=R×Ncs and Ni=R×Nis, respectively, for every rate matching block. It is determined that each rate matching block separately repeats the same number of the channel-encoded symbols, on the assumption that the error sensitivity of encoded symbols is almost the same for every symbol in one frame. That is, an almost uniform repetition pattern is provided within one frame regardless of the various repetition bit numbers (y=Ni−Nc) determined according to the service type. This is because it is possible that the whole symbols in one frame can be uniformly repeated for the convolutional code.

Therefore, in accordance with this embodiment of the present invention, the symbols encoded by the convolutional encoder 210 are separated by the same number and provided to the rate matching blocks 231, 232 and 233. The rate matching blocks 321, 232 and 233 each repeat the same number of input symbols. At this point, the repetition pattern parameters can be determined either equally or differently. That is, the repetition patterns can be determined either equally or differently for the rate matching blocks 231, 232 and 233.

2. Another Embodiment of a Rate Matching Device by Repeating (for a Turbo Code)

Figure 10:
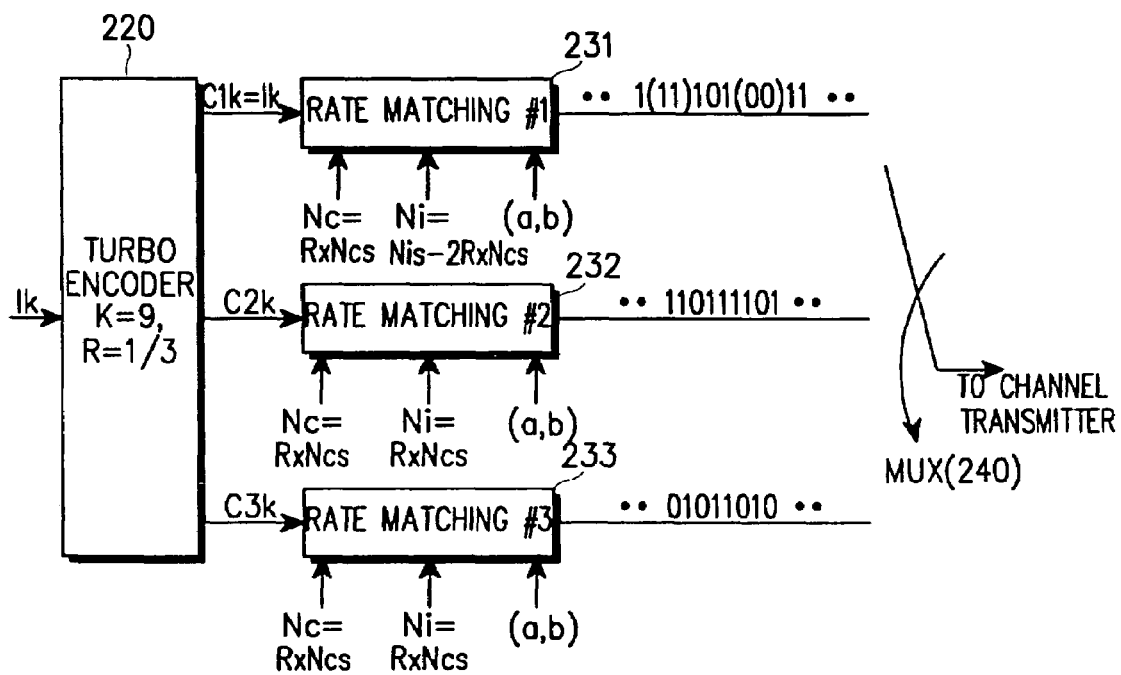
FIG. 10 is a diagram illustrating a structure of a rate matching device by repeating according to another embodiment of the present invention.

FIG. 10 shows the structure of a rate matching device by repeating according to another embodiment of the present invention. This structure is used when the rate matching devices of FIG. 2 and 3 rate match turbo-encoded symbols by repeating.

Referring to FIG. 10, a turbo encoder 220 encodes input information bits Ik at a coding rate R=⅓, and outputs encoded symbols C1k, C2k and C3k. Among the encoded symbols, the information symbol C1k is separately provided to a first rate matching block 231, and the parity symbols (or redundancy symbols) C2k and C3k are separately provided to second and third rate matching blocks 232 and 233, respectively. The turbo encoder 220 is comprised of a first component encoder 222, a second component encoder 224 and an interleaver 226, as shown in FIG. 6. The component encoders 222 and 223 may use recursive systematic codes (RSC). The structure of the turbo encoder 220 is well known by those skilled in the art. Thus, a detailed description will be avoided. The input X(t) to the turbo encoder 220 corresponds to the input information bits Ik shown in FIG. 10. Outputs X(t), Y(t) and Y'(t) of the turbo encoder 220 correspond to the encoded symbols C1k, C2k and C3k shown in FIG. 10, respectively. For the first output of the turbo encoder 220, the input information bits Ik are output at as they are, so that the input information bits Ik are output as C1k in FIG. 10.

The first rate matching block 231 repeats the encoded symbols C1k based on the following criteria. Since the coding rate is R=⅓, the input symbol number Nc is determined as Nc=R×Ncs=Ncs/3, which is ⅓ the total number of input symbols (encoded symbol). The output symbol number Ni is determined as Ni=Nis−(2R×Ncs), since repeating should be performed according to Condition 1D. The repetition pattern determining parameters 'a' and 'b' can be set to given integers according to a desired repetition pattern. The integers are determined depending on the repetition pattern only, and the parameters can be typically set to b=1 and a=2. A detailed description of a method for determining the integers for the repetition pattern determining parameters will be made with reference to the tables below. For example, the first rate matching block 231 may output the symbols of ' . . . 1(11) 101(00)11 . . . ' (where (11) and (00) indicate repeated symbols).

The second rate matching block 232 outputs the encoded symbols C2k without repetition. However, the second rate matching block 232 may repeat the encoded symbols C2k in certain conditions such as severe repetition. Since the coding rate is R=⅓, the input symbol number Nc is determined as Nc=R×Ncs=Ncs/3, which is ⅓ the total number of input symbols. The output symbol number Ni is determined as Ni=R×Ncs which is equal to the input symbol number, since the two kinds of parity symbols should not be repeated according to Condition 2D and Condition 4D. For example, the second rate matching block 232 may output the symbols of '. . . 110111101 . . . ' where there is no repetition.

The third rate matching block 233 outputs the encoded symbols C3$k$ without repetition. However, the third rate matching block 233 may also repeat the encoded symbols C3$k$ in certain conditions such as severe repetition. Since the coding rate is R=⅓, the input symbol number Nc is determined as Nc=R×Ncs=Ncs/3, which is ⅓ the total number of input symbols. The output symbol number Ni is determined as Ni=R×Ncs which is equal to the input symbol number, since the two kinds of parity symbols should not be repeated according to Condition 2D and Condition 4D. The repetition pattern determining parameters 'a' and 'b' can be set to given integers according to a desired repetition pattern. However, if blocks 232 or 233 do not use repetition, then (a,b) parameters are meaningless for rate matching blocks 232 or 233. The integers are determined depending on the repetition pattern only, and the parameters can be typically set to b=1 and a=2. A detailed description of a method for determining the integers for the repetition pattern determining parameters will be made with reference to the tables below. For example, the third rate matching block 233 may output the symbols of '. . . 01011010 . . .' which have not experienced repetition.

In FIG. 10, the symbols encoded by the turbo encoder 220 are separated in the same number and then provided to the rate matching blocks 231, 232 and 233. The first rate matching block 231 receives the information symbols out of the encoded symbols and repeats the received symbols according to a predetermined repetition pattern. The second and third rate matching blocks 232 and 233 receive the parity symbols out of the encoded symbols, and output the received symbols as they are, without repetition.

3. Determination of Parameters for Repeating

As described above, the repetition patterns used for the respective rate matching blocks may be either identical or different. That is, the symbol repetition pattern used in the respective rate matching blocks and the number of repeated symbols can be variably determined. If the number Ni of the symbols output from the respective rate matching blocks is differently set, the number of symbols repeated by the respective rate matching blocks will be determined differently. Further, the pattern of the symbols repeated by the respective rate matching blocks can be determined either equally or differently, by changing the repetition pattern determining parameters 'a' and 'b'. That is, even though having a single structure, a rate matching device according to the present invention can differently determine parameters such as the input symbol number, the output symbol number, the number of symbols to be repeated and the repetition pattern determining parameters.

Table 4 below shows various cases of parameters, by way of example. Herein, the coding rate is assumed to be R=⅓. Therefore, there are provided three rate matching blocks, and the respective rate matching blocks separately receive the same number of symbols, i.e., Nc=Ncs/3 symbols. Herein, the rate matching blocks separately receive the same number of the symbols, determined by multiplying the number of the encoded symbols by the coding rate. However, it should be noted that the present invention can also be applied to a case where the rate matching blocks separately receive a different number of symbols, i.e., a number of symbols smaller than the number determined by multiplying the number of the encoded symbols in a frame by the coding rate, or a number of symbols which is larger than the number determined by multiplying the number of the encoded symbols in a frame by the coding rate. In the description below, RMB1, RMB2 and RMB3 denote first to third rate matching blocks, respectively.

TABLE 4

| Case | RMB1 | | | | RMB2 | | | | RMB3 | | | |
|---|---|---|---|---|---|---|---|---|---|---|---|---|
| | Nc | Ni | a | b | Nc | Ni | a | b | Nc | Ni | a | b |
| 1 | Ncs/3 | Nis − 2Ncs/3 | 2 | 1 | Ncs/3 | Nis/3 | NA | NA | Ncs/3 | Nis/3 | NA | NA |
| 2 | Ncs/3 | Nis − 2Ncs/3 | p | q | Ncs/3 | Nis/3 | NA | NA | Ncs/3 | Nis/3 | NA | NA |
| 3 | Ncs/3 | Nis/p | s | t | Ncs/3 | Nis/q | s | t | Ncs/3 | Nis/r | s | t |
| 4 | Ncs/3 | Nis/p | s | t | Ncs/3 | Nis/3 | u | v | Ncs/3 | Nis/3 | w | x |

In Table 4, RMB1, RMB2 and RMB3 indicates rate matching blocks, and p, q, r, s, t, w and x are given integers. NA (Not Available) indicates that the input symbols are output as they are, without repetition, for which the parameters 'a' and 'b' can be set to any value. Here, the parameters 'a' and 'b' are positive numbers. Further, the case where the input symbols are repeated to perform rate matching so that the number of the input symbols is smaller than or equal to the number of the output symbols (i.e., Ncs<=Nis) is shown. Reference will be made to each Case.

Case 1: In systematic repetition, information symbols are repeated, but the parity symbols are not repeated. The repetition pattern determining parameters are set to a=2 and b=1.

Case 2: In systematic repetition, information symbols are repeated, but the parity symbols are not repeated. The repetition pattern determining parameters are set to a=p and b=q.

Case 1 and Case 2 can be applied when only the turbo-encoded information symbols are repeated as shown in FIG. 10.

Case 3: Both the information symbols and the parity symbols are repeated, and the repetition patterns are equally determined for all of RMB1, RMB2 and RMB3. The number of repeated symbols is equal for RMB 1, RMB2 and RMB3.

Case 4: Both the information symbols and the parity symbols are repeated, and the repetition patterns are differently determined for all or some of RMB1, RMB2 and RMB3. The number of repeated symbols is equal for RMB2 and RMB3.

Table 5 below shows the variation in repetition patterns according to a change in the parameter 'a'. It is assumed in Table 5 that Nc=8, Ni=10, y=Ni−Nc=10−8=2, and b=1. The symbols repeated according to the repetition pattern are represented by '( )'.

TABLE 5

| Case | A | Input Symbols | Output Symbols |
| --- | --- | --- | --- |
| Case 1 | 1 | 1 2 3 4 5 6 7 8 | (11) 2 3 (44) 5 6 7 8 |
| Case 2 | 2 | 1 2 3 4 5 6 7 8 | 1 (22) 3 4 5 (66) 7 8 |
|  | 5 | 1 2 3 4 5 6 7 8 | (11) 2 3 4 (55) 6 7 8 |
|  | 10 | 1 2 3 4 5 6 7 8 | (11) 2 3 4 (55) 6 7 8 |
|  | 100 | 1 2 3 4 5 6 7 8 | (11) 2 3 4 (55) 6 7 8 |

It is noted from Table 5 that it is possible to obtain the various repetition patterns by fixing 'b' to '1' and setting 'a' to different values. Of course, it is possible to obtain more various repetition patterns by changing the parameter 'b' as well. In addition, it is possible to always repeat the first symbol by setting the parameter 'b' to 1 and using a value satisfying Equation 2 below for the parameter 'a'. Therefore, to satisfy Condition 3D, the parameter 'a' should be set to a value within a range of Equation 2.

$$a > \lfloor Nc/y \rfloor \quad (2)$$

where $\lfloor Nc/y \rfloor$ is the largest integer less than or equal to $Nc/y$.

In Equation 2, for Nc=8 and y=2, Nc/y=8/2=4. Therefore, if 'a' has a value larger than 4, the first symbols will be repeated.

In order to satisfy Condition 5D, the tail bits should be repeated. To this end, Nc should be set to a value determined by adding the number of the tail bits thereto. That is, if the input symbol number Nc is set to Nc+NT where NT denotes the number of tail bits, the tail bits for the information symbols will always be repeated, thus satisfying Condition 5D. In other words, for repetition, even the tail bits are entered into the rate matching block and considered for repetition.

4. Rate Matching Algorithm by Repeating

Figure 11:
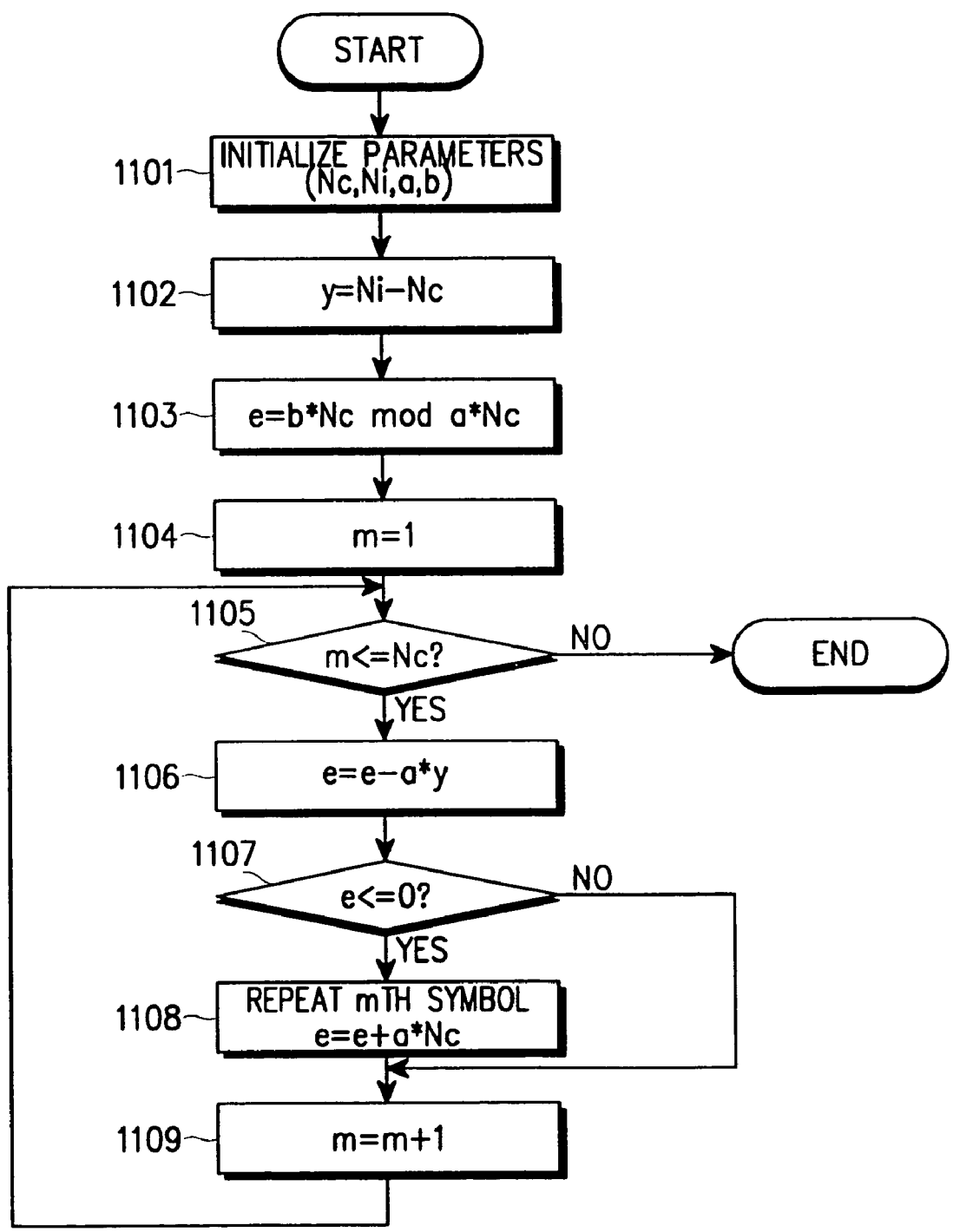
FIG. 11 is a flow chart illustrating a rate matching procedure by repeating according to an embodiment of the present invention.

FIG. 11 shows a rate matching procedure by repeating according to an embodiment of the present invention. This procedure is performed based on a rate matching algorithm shown in Table 6 below. In Table 6, "So={d1,d2, . . . ,dNc}" denotes the symbols input for rate matching, i.e., the symbols input in a frame unit for rate matching, and is comprised of Nc symbols in total. A shift parameter S(k) is an initial value used in the algorithm, and is constantly set to '0' when a rate matching device according to the present invention is used in a downlink of a digital communication system (i.e., when rate matching is performed on the encoded symbols to be transmitted from the base station to the mobile station). 'm' indicates the order of the symbols input for rate matching, and has the order of 1, 2, 3, . . . , Nc. It is noted from Table 6 that the parameters including the input symbol number Nc, the output symbol number Ni and the repetition pattern determining parameters 'a' and 'b' can be changed. For example, the parameters can be changed as shown in Table 4. The input symbol number Nc can be determined as a value other than Ncs/3, according to the coding rate R. FIG. 11 corresponds to the case where the algorithm of Table 6 is applied to a downlink of the digital communication system, i.e., S(k)=0.

TABLE 6

```
Let's denote:
    So = {d1,d2,...,dNc} = set of Nc data bits
The rate matching rule is as follows:
if repetition is to be performed
    y = Ni−Nc
    e = (2*S(k)*y + bNc) mod aNc
        → initial error between current and desired repetition ratio (downlink: S=0)
    if e = 0 then e = aNc
    m = 1        → index of current bit
    do while m <= Nc
        e = e − a*y      → update error
        do while e <= 0 then    → check if bit number m should be repeated
            repeat bit m from set So
            e = e + a*Nc   → update error
        end do
        m = m + 1       → next bit
    end do
end if
```

When the algorithm of Table 6 is used, the following advantages are provided.

First, it is possible to variably repeat the encoded symbols (or codeword symbols) of frame unit.

Second, it is possible to generate various repetition patterns by adjusting the parameters Nc, Ni, a and b.

Third, it is possible to reduce the complexity and calculating time of each rate matching block by 1/R. This is because if a plurality of rate matching blocks are used, the number of the symbols to be repeated by each rate matching block will be reduced, as compared with the case where one rate matching block is used. For example, the number of symbols which can be repeated by each rate matching block can be reduced by the coding rate R, as compared with the case where one rate matching block is used.

Referring to FIG. 11, in step 1101, all sorts of parameters including the input symbol number Nc, the output symbol number Ni and the repetition pattern determining parameters 'a' and 'b' are initialized for the rate matching process. When Nc and Ni are determined by parameter initialization, the number of symbols to be repeated is determined by y=Ni−Nc, in step 1102. In step 1103, an initial error value 'e' between current and desired repetition ratios is calculated. The initial error value is determined by e=b*Nc mod a*Nc.

Next, in step 1104, 'm' indicating the order of the input symbols is set to '1' (m=1). Thereafter, in steps 1105 to 1109, the symbols are examined from the initial symbol as to whether they should be repeated or not. If it is determined in step 1107 that the calculated error value 'e' is smaller than or equal to '0', the corresponding symbol is repeated and then the error value is updated by e=e+a*Nc, in step 1108. Otherwise, if it is determined in step 1107 that the calculated error value 'e' is larger than '0', repetition is not performed. The operation of receiving the encoded symbols in order, determining whether to perform repetition on the received symbols, and performing repetition accordingly, is repeatedly performed until it is determined in step 1105 that all the symbols in one frame are completely received. During the repetition process, the error value is updated by e=e−a*y in step 1106.

As described above, the data communication system according to the present invention can perform rate matching on both symbols channel-encoded with a non-systematic code and symbols channel-encoded with a systematic code, using a single structure. Therefore, the data communication system supporting both non-systematic codes and systematic codes can selectively rate match symbols channel-encoded with a non-systematic code or symbols channel-encoded with a systematic code, thereby increasing efficiency of data transmission and improving system performance.

The present invention has the following advantages.

First, it is possible to freely set the puncturing/repetition patterns by adjusting the parameters of the rate matching blocks, and all the conditions which should be considered when rate matching the turbo-encoded symbols can be satisfied by simply adjusting the parameters.

Second, it is possible to implement all of the rate matching blocks according to the coding rate R by using the same algorithm, and the rate matching blocks are simple in structure.

Third, a system using both convolutional codes and turbo codes can support both convolutional codes and turbo codes, using a single rate matching device rather than using different rate matching devices, by simply setting different initial parameters.

Fourth, it is not necessary to implement the rate matching blocks differently according to a convolutional code or a turbo code.

Fifth, by setting the number of input symbols to a value determined by adding the number of the tail bits the number of non-tail bits so that the tail bits are repeated, the novel rate matching device is useful when a SOVA decoder is used or when performance would be degraded due to not repeating of the tail bits.

Sixth, by setting the puncturing pattern determining parameter 'b' to '1' and setting the parameter 'a' to a value within a specific range, it is possible to prevent the first symbol in one frame from being punctured. Further, it is possible to repeat the first symbol in one frame by setting the repetition pattern determining parameter 'b' to '1' and setting the parameter 'a' to a value within a specific range.

While the invention has been shown and described with reference to a certain preferred embodiments thereof, it will be understood by those skilled in the art that various changes in form and details may be made therein without departing from the spirit and scope of the invention as defined by the appended claims.

What is claimed is:

1. A rate matching device, which punctures a part of encoded input information bits, for a data communication system having a turbo encoder for the encoding input information bits at a predetermined code rate and outputting a systematic bit stream, a first parity bit stream and a second parity bit stream for the input information bits to generate encoded bits of the input information bits, comprising:

a first rate matching block to receive the first parity bit stream and puncture a determined number of first parity bits in the first parity bit stream; and a second rate matching block to receive the second parity bit stream and puncture a determined number of second parity bits in the second parity bit steam, wherein the first parity bit stream is different from the second parity bit stream, and at least one of said first and second rate matching blocks is adapted to rate-match its respective parity bits, and a part of said first and second parity bits are rate-matched in each of said first and second rate matching blocks respectively according to rate matching parameters corresponding to each rate matching block.

2. The rate matching device as claimed in claim 1, further comprising a multiplexer for multiplexing the systematic bit stream and the punctured parity bit streams.

3. The rate matching device as claimed in claim 2, wherein the number of bits to be punctured is based on the number of input bits and output bits of the rate matching device.

4. The rate matching device as claimed in claim 1, wherein the rate matching parameters include a first parameter for determining a position of a bit to be first punctured in the first parity bit stream or the second parity bit stream and a second parameter for determining a period of the bits to be punctured in the first parity bit stream or the second parity bit stream.

5. The rate matching device as claimed in claim 1, wherein the rate matching parameters include the number of input bits and the number of output bits at each of the first and second rate matching blocks.

6. The rate matching device as claimed in claim 1, wherein the bits to be punctured among the parity stream is controlled by a subtraction function between e and y, and a comparison function between a result of the subtraction function and a threshold, where e is an initial error value, y is the difference between the number of input bits of the rate matching means and the number of output bits of the rate matching means.

7. A rate matching device of a data communication system having a turbo encoder for encoding input information bits at a predetermined code rate and outputting a systematic bit stream, a first parity bit streams and a second parity bit stream for the input information bits to generate an encoded bits of the input information bits, comprising:

a first rate matching block to receive the systematic bit stream and rate match a determined number of systematic bits in the systematic bit stream;

a second rate matching block to receive the first parity bit stream and rate match a determined number of first parity bits in the first parity bit stream; and a third rate matching block to receive the second parity bit stream and rate match a determined number of second parity bits in the second parity bit stream; and a multiplexer to multiplex the rate matched bit streams, wherein at least one of the rate matching blocks rate matches respective systematic or parity bits with corresponding rate matching parameters.

8. A rate matching device of a data communication system having a turbo encoder for encoding input information bits with a predetermined coding rate and outputting a systematic bit stream, a first parity bit stream and a second parity bit stream for the input information bits to generate encoded bits of the input information bits, the device comprising:

a first rate matching means for receiving the first parity bit stream and puncturing a determined number of first parity bits in the first parity bit stream; and a second rate matching means for puncturing a determined number of second parity bits in the second parity bit steam, wherein the first parity bit stream is different from the second parity bit stream, and wherein at least one of said first and second rate matching means punctures a determined number of parity bits in a respective parity bit stream, and a part of said first and second parity bits are punctured in each of the rate matching means respectively according to rate matching parameters corresponding to each rate matching means.

9. The rate matching device as claimed in claim 8, wherein the device further includes a multiplexer for collecting the systematic bit stream and the rate matched parity bit streams.

10. The rate matching device as claimed in claim 8, wherein the rate matching parameters are a first parameter (a) for determining a position of a bit to be first punctured in one frame and a second parameter (b) for determining a period of the bits to be punctured in one frame.

11. The rate matching device as claimed in claim 10, wherein each of the rate matching means punctures a determined number of parity bits in a respective parity bit stream according to the corresponding rate matching parameters and the numbers of bits output from the rate matching means.

12. The rate matching device as claimed in claim 10, wherein the number of bits output from the rate matching means are different from one another.

13. The rate matching device as claimed in claim 10, wherein the numbers of bits output from the rate matching means are equal to one another.

14. The rate matching device as claimed in claim 10, wherein the number of bits output from at least one rate matching means is different from the number of bits output from at least one other rate matching means.

15. The rate matching device as claimed in claim 10, wherein each of the rate matching means has the same corresponding rate matching parameters.

16. The rate matching device as claimed in claim 10, wherein each of the rate matching means has corresponding rate matching parameters and the first parameters of each of the corresponding rate matching parameters are equal to one another.

17. The rate matching device as claimed in claim 10, wherein each of the rate matching means has corresponding rate matching parameters, and the first parameters of each of the corresponding rate matching parameters are different from one another.

18. The rate matching device as claimed in claim 10, wherein each of the rate matching means has corresponding rate matching parameters, and the second parameters of each of the corresponding rate matching parameters are equal to one another.

19. The rate matching device as claimed in claim 10, wherein each of the rate matching means has corresponding rate matching parameters, and the second parameters of each of the corresponding rate matching parameters are different from one another.

20. The rate matching device as claimed in claim 8, wherein the bits to be punctured among the parity stream is controlled by a subtraction function between e and y, and a comparison function between a result of the subtraction function and a threshold, where e is an initial error value, y is the difference between the number of input bits of the rate matching means and the number of output bits of the rate matching means.

21. A rate matching device of data communication system having a turbo encoder for encoding input information bits with a predetermined coding rate and outputting a systematic bit stream, a first parity bit streams and a second parity bit stream for the input information bits to generate encoded bits of the input information bits, the device comprising:

a first rate matching means for receiving the systematic bit stream and rate matching a determined number of systematic bits in the systematic bit stream;

a second rate matching means for receiving the first parity bit stream and rate matching a determined number of first parity bits in the first parity bit stream; and a third rate matching means for receiving the second parity bit stream and rate matching a determined number of second parity bits in the second parity bit stream;

wherein at least one of the rate matching means is adapted to rate match respective systematic or parity bits, and a part of the encoded bits are rate matched in each of the rate matching means respectively according to rate matching parameters corresponding to each rate matching means.

22. The rate matching device as claimed in claim 21, wherein the bits to be punctured among the parity stream is controlled by a subtraction function between e and y, and a comparison function between a result of the subtraction function and a threshold, where e is an initial error value, y is the difference between the number of input bits of the rate matching means and the number of output bits of the rate matching means.

23. The rate matching device as claimed in claim 21, wherein the system further includes a multiplexer for collecting the rate matched bit streams.

24. A rate matching device of data communication system having a turbo encoder for encoding input information bits with a predetermined coding rate and outputting a systematic bit stream, a first parity bit streams and a second parity bit stream for the input information bits to generate encoded bits of the input information bits, the device comprising:

a first rate matching means for receiving the systematic bit stream and outputting the systematic bit stream, a second rate matching means for receiving the first parity bit stream and puncturing a determined number of first parity bits in the first parity bit stream, and a third rate matching means for receiving the second parity bit stream and puncturing a determined number of second parity bits in the second parity bit stream;

wherein each of the rate matching means punctures a determined number of parity bits in a respective parity bit stream, and a part of the encoded bits are punctured in each of the rate matching means respectively can be controlled according to rate matching parameters.

25. The rate matching device as claimed in claim 24, wherein the bits to be punctured among the parity stream is controlled by a subtraction function between e and y, and a comparison function between a result of the subtraction function and a threshold, where e is an initial error value, y is the difference between the number of input bits of the rate matching means and the number of output bits of the rate matching means.

26. The rate matching device as claimed in claim 25, wherein the system further includes a multiplexer for collecting the rate matched bit streams.

27. The rate matching device as claimed in claim 26, wherein rate matching parameters are a first parameter (a) for determining a position of a bit to be first punctured in one frame and a second parameter (b) for determining a period of the bits to be punctured in one frame.

28. The rate matching device as claimed in claim 27, wherein each of the rate matching means punctures a determined number of bits in a respective bit stream according to the corresponding rate matching and the numbers of bits output from the rate matching means.

29. The rate matching device as claimed in claim 27, wherein the numbers of bits output from the rate matching means are equal to one another.

30. The rate matching device as claimed in claim 27, wherein the numbers of bits output from the rate matching means are different from one another.

31. The rate matching device as claimed in claim 27, wherein the number of bits output from at least one rate matching means is different from the number of bits output from at least one other rate matching means.

32. The rate matching device as claimed in claim 27, wherein each of the rate matching means has the same corresponding rate matching parameters.

33. The rate matching device as claimed in claim 27, wherein each of the rate matching means has corresponding rate matching parameters and the first parameters of each of the corresponding rate matching parameters are equal to one another.

34. The rate matching device as claimed in claim 27, wherein each of the rate matching means has corresponding rate matching parameters, and the first parameters of each of the corresponding rate matching parameters are different from one another.

35. The rate matching device as claimed in claim 27, wherein each of the rate matching means has corresponding rate matching parameters, and the second parameters of each of the corresponding rate matching parameters are equal to one another.

36. The rate matching device as claimed in claim 27, wherein each of the rate matching means has corresponding rate matching parameters, and the second parameters of each of the corresponding rate matching parameters are different from one another.

37. A rate matching device of data communication system having a channel encoder for encoding input information bits with predetermined code rate and outputting encoded bit stream for the input information bits to generate an encoded bits of the input information bits, and a rate matching function for rate matching a number of bits from the encoded bits to match a number of bits outputting from the rate matching function with given bits number of transmission channel, the system comprising:
 a multiplexer for multiplexing the encoded bits and outputting multiplexed bits;
 a rate matching function for rate matching determined number of the multiplexed bits in accordance with rate matching parameters; and
 a memory for storing rate matching parameters, which are determined according to a kind of bit stream,
 wherein the rate matching function receives the rate matching parameters sequentially and rate matches the multiplexed bits in accordance with the received rate matching parameters.

38. The rate matching device as claimed in claim 37, wherein if the number of input bits is more than the number of output bits at the rate matching function, and the rate matching function punctures the determined number of the multiplexed bits according to corresponding rate matching parameters.

39. The rate matching device as claimed in claim 37, wherein if the number of output bits is more than the number of input bits at the rate matching function, and the rate matching function repeats the determined number of multiplexed bits according to corresponding rate matching parameters.

40. The rate matching device as claimed in claim 37, wherein the channel encoder is a turbo encoder, and the rate matching function rate matches the multiplexed bits with rate matching parameters corresponding to a systematic bit stream and a parity bit streams.

41. The rate matching device as claimed in claim 37, wherein if the channel encoder is convolutional encoder, and the rate matching function rate matches the multiplexed bits with same rate matching parameters.

42. The rate matching device as claimed in claim 37, wherein the rate matching parameters include the number of input multiplexed bits and the number of output bits from the rate matching function.

43. The rate matching device as claimed in claim 37, wherein the parameters further include a position parameter for determining a position of an input multiplexed bit to be first rate matched in the multiplexed bits and a period parameter for determining a period of the input multiplexed bits to be rate matched in the multiplexed bits.

44. The rate matching device as claimed in claim 37, wherein the number of bits to be rate matched is based on the number of the input multiplexed bits and the number of the output bits.

45. A rate matching method in a data communication system having a channel encoder for encoding input information bits with predetermined code rate and outputting encoded bit stream for the input information bits to generate an encoded bits of the input information bits, and a rate matching function for rate matching a number of bits from the encoded bits to match a number of bits outputting from the rate matching function with given bits number of transmission channel, the method comprising the steps of:
 (a) multiplexing the encoded bits and outputting multiplexed bits;
 (b) receiving the rate matching parameters sequentially;
 (c) determining the number of the encoded bits to be rate matched comparing to the number of input bits and the number of output bits at rate matching function;
 (d) rate matching a number of the determined multiplexed bits in accordance with a rate matching parameters, which are determined according to a kind of bit stream; and
 (e) multiplexing the output bit stream from rate matching function.

46. The rate matching method of claim 45, wherein if the number of input bits is more than the number of output bits in rate matching bock, and the rate matching function punctures the determined number of the multiplexed bits according to corresponding rate matching parameters.

47. The rate matching method of claim 45, wherein if the number of input bits is more than the number of output bits in rate matching bock, and the rate matching function repeats the determined number of the multiplexed bits according to corresponding repetition parameters.

48. The rate matching method of claim 45, wherein if the channel encoder is turbo encoder, and the rate matching function rate matches the multiplexed bits with rate matching parameters based on a systematic bit stream and a parity bit stream.

49. The rate matching method of claim 45, wherein if the channel encoder is convolutional encoder, and the rate matching function rate matches the multiplexed bits with same rate matching parameters.

50. The rate matching method of claim 45, wherein the parameters include the number of input multiplexed bits and the number of output bits from the rate matching function.

51. The rate matching method of claim 45, wherein the number of bits to be rate matched is based on the number of the input multiplexed bits and the number of the output bits.

52. The rate matching method of claim 45, wherein the parameters further include a position parameter for determining a position of an input multiplexed bit to be first rate matched in the multiplexed bits and a period parameter for determining a period of the input multiplexed bits to be rate matched in the multiplexed bits.

* * * * *